US006538959B1

(12) United States Patent
Yamaguchi et al.

(10) Patent No.: US 6,538,959 B1
(45) Date of Patent: Mar. 25, 2003

(54) DISPLAY PLATE FOR TIMEPIECES AND METHOD FOR FABRICATING THE SAME

(75) Inventors: Katsuyuki Yamaguchi, Tokyo (JP); Katsuaki Tamaru, Iruma (JP); Hiroshi Ikebuchi, Kawasaki (JP)

(73) Assignees: Citizen Watch Co., Ltd., Tokyo (JP); Yamamoto Mfg. Co., Ltd., Tokyo (JP)

(*) Notice: Subject to any disclaimer, the term of this patent is extended or adjusted under 35 U.S.C. 154(b) by 0 days.

(21) Appl. No.: 09/424,187

(22) PCT Filed: May 21, 1998

(86) PCT No.: PCT/JP98/02236

§ 371 (c)(1), (2), (4) Date: Nov. 19, 1999

(87) PCT Pub. No.: WO98/53373

PCT Pub. Date: Nov. 26, 1998

(30) Foreign Application Priority Data

May 22, 1997 (JP) ............................................ 9-132158

(51) Int. Cl.[7] ......................... G04B 1/00; G04B 19/06; G04C 3/00; H01L 25/00

(52) U.S. Cl. ....................... 368/205; 368/223; 368/232; 136/251; 136/259

(58) Field of Search ................................ 368/205, 223, 368/228, 232, 234, 239, 76, 80, 82, 309; 136/251, 256, 259

(56) References Cited

U.S. PATENT DOCUMENTS 5,761,158 A * 6/1998 Azuma et al. .............. 136/251
5,841,738 A * 11/1998 Kamei et al. ............... 368/205
6,225,552 B1 * 5/2001 Nishi et al. ................. 136/249
6,229,766 B1 * 5/2001 Saurer et al. ............... 368/205
6,268,558 B1 * 7/2001 Kubota ........................ 136/244
6,310,836 B1 * 10/2001 Fujii et al. .................. 368/205

FOREIGN PATENT DOCUMENTS

| | | |
|---|---|---|
| EP | 0 697 636 A1 | 2/1996 |
| EP | 0 872 783 A1 | 10/1998 |
| JP | 57-126665 A | 8/1982 |
| JP | 60148172 | 8/1985 |
| JP | 7-333355 A | 12/1995 |
| JP | 9-269382 A | 10/1997 |

* cited by examiner

*Primary Examiner*—Vit Miska
(74) *Attorney, Agent, or Firm*—Webb Ziesenheim Logsdon Orkin & Hanson, P.C.

(57) ABSTRACT

An indicating plate for a timepiece is provided which is so structured as to prevent viewing of the solar cell and other items arranged thereunder through the indicating plate, which permits the same design expression as realized by the conventional metallic indicating plate and extensively increases a design variation inclusive of a ton (delicate hue) and pattern with superior-quality appearance and which has an excellent appearance quality to thereby ensure and enhance commercial value. The indicating plate for the timepiece is a timepiece indicating plate arranged on the front surface side of a solar cell housed in a timepiece. The timepiece indicating plate comprises a resin substrate through which light can be transmitted and metallic thin film layer coating formed on at least one side of the resin substrate by dry plating. The timepiece indicating plate not only is capable of preventing viewing of the solar cell from outside thereof through the timepiece indicating plate but also has a light transmission at least sufficient to cause the solar cell housed under the timepiece indicating plate to generate power.

39 Claims, 12 Drawing Sheets

(A)

(B)

(C)

DISPLAY PLATE FOR TIMEPIECES AND METHOD FOR FABRICATING THE SAME

BACKGROUND OF THE INVENTION

1. Technical Field

The present invention relates to an indicating plate (dial) for a timepiece arranged on a front surface side of a solar battery (solar cell) housed in a timepiece, the solar cell capable of converting light energy to electric energy for utilization thereof.

2. Background Art

It is common practice to employ a solar cell as a power source for watches, desktop electronic calculators, portable radio sets, etc. This solar cell is generally constructed of, for example, amorphous silicon and converts light energy to electric energy. In view of this function, the solar cell must be arranged in a position upon which light is incident, i.e., a surface position such that the solar cell is directly visible from outside.

The solar cell is commonly used in an indicating plate structure for wristwatch, which is constructed so that, referring to FIGS. 23 and 24, four solar cells 132 which are fan-shaped in a plan view are arranged, with an insulating band 133 therebetween, on an upper surface of wristwatch module 131. Further, a translucent resin thin film layer 135 is laminated onto part or the entire surface of each of the solar cells 132, with transparent plate 134 of a transparent polycarbonate (polycarbonic ester) resin or acrylic resin interposed therebetween.

In this indicating plate structure for a solar watch, however, the solar cells 132 are generally brown or dark-blue, so that, for example, the solar cells disposed under the transparent plate are viewed through the transparent plate. Thus, the dial takes on the color of the solar cells. Further, the insulating band 133 is between neighboring solar cells 132, so that the insulating bands 133 appear as cross lines. Thus, not only is the design inclusive of color tone extremely restricted, but also the appearance is degraded to thereby lower the commercial value.

On the contrary, a watch was proposed in which, for example, an interference filter was disposed on a front side of a solar cell to thereby prevent direct viewing of the solar cell. However, problems were encountered such that the supply of light energy to the solar cell was hampered and such that the appearance quality as watch dial was poor.

For solving these problems, for example, Japanese Patent Publication No. 5(1993)-38464 disclosed a colored solar cell comprising a solar cell and a color diffusing layer composed of a color filter disposed on a front side of the solar cell and capable of transmitting light having a wavelength within a region contributing to power generation of the solar cell and a scattering layer disposed between the solar cell and the color filter, which scattering layer was capable of transmitting a portion of the light transmitted through the color filter and scattering the rest of the light in all directions.

A white diffusion plate was employed as this scattering layer, and it was suggested to use as the white diffusion plate, for example, an acrylic milk white plate, a half mirror coated with a matting clear lacquer, a glass having one side roughened by blasting or a white diffusion plate having a mirror formed of, for example, aluminum in a stripe or net pattern on a side opposite to plastic.

However, in this prior art, although the acrylic milk white plate is used as the scattering layer, a metal tone favored in an indicating plate of wristwatch and capable of imparting an appearance of superior quality can not be obtained. Further, burrs occur at the time of working, thereby necessitating deburring. Accordingly, the process is complicated and the cost is increased. With respect to the half mirror coated with a matting clear lacquer, half mirror treatment and coating are required to thereby complicate the process. Further, it is probable that, depending on coating operation, the film thickness becomes nonuniform to thereby cause a dispersion of transmission factor with the result that mottling occurs. Moreover, with respect to the glass having one side thereof roughened by blasting or the white diffusion plate having a mirror formed of, for example, aluminum in a stripe or net pattern on a side opposite to plastic, blasting and mirror treatment are required to thereby complicate the process. Furthermore, depending on these treatments, the problem is encountered such that the film thickness and irregularity degree become nonuniform to thereby invite a dispersion of transmission factor and a mottling. Still further, all the above materials have a problem such that the appearance quality thereof as a watch dial is poor.

At any rate, the interposition of the above scattering layer between the color filter and the solar cell unfavorably requires a complicated process and invites a dispersion of transmission factor leading to a deterioration of power generation performance and an occurrence of mottling. Further, a deterioration of appearance quality due to the property of material per se is invited.

Furthermore, although, with respect to the metallic indicating plate for use in the indicating plate structure of the conventional timepiece, a design diversification can be attained by, for example, its peculiar metal color. In addition, in this case, various models thereof with a high quality and high grade appearance have been proposed. However, the metallic indicating plate cannot be employed in the solar watch because the use of the metallic indicating plate intercepts light to thereby disenable the power generation by the solar cell. Therefore, it has been unfeasible to realize an appearance of superior quality peculiar to metal color and an extensive design variation on the solar watch.

SUMMARY

The present invention has been made taking the above problems into account. Therefore, it is an object of the present invention to provide an indicating plate for a timepiece through which the insulating band cross lines and solar cell positioned under the indicating plate are not viewed. Furthermore, the indicating plate of the present invention can be provided with a metallic color peculiar to metal and enables the same design expression as attained by the conventional metallic indicating plate. Still further, according to the indicating plate of the present invention, a design variation inclusive of a tone (delicate hue) and pattern with superior-quality appearance are extensively increased and an excellent appearance quality is accomplished to thereby ensure an enhanced commercial value.

The present invention has been made with a view toward solving the above problems of the prior art and attaining the above object. Accordingly, the indicating plate for a timepiece according to the present invention is an indicating plate for a timepiece to be arranged on a front surface side of a solar cell housed in a timepiece, the timepiece indicating plate comprising a resin substrate through which light can be transmitted and a metallic thin film layer coating formed on at least one side of the resin substrate by dry plating, the timepiece indicating plate not only capable of preventing viewing of the solar cell from outside thereof through the timepiece indicating plate but also having a light transmission at least sufficient to cause the solar cell housed under the timepiece indicating plate to generate power.

In this construction, the metallic thin film layer coating prevents viewing therethrough of the solar cell and cross lines disposed under the timepiece indicating plate. Some light is transmitted through the metallic thin film layer coating, and the light transmission is so large as to contribute to the power generation of the solar cell. Thus, the function of the solar timepiece per se is not inhibited. Moreover, coloring can be made by the metallic color peculiar to metal possessed by the metallic thin film layer coating, thereby enabling extensively increasing a design variation.

In this construction, although the thickness of the metallic thin film layer coating can appropriately be set taking the light transmission, etc. into account, it is preferred that the metallic thin film layer coating have a thickness of 100 to 500 Å. The reason is that the solar cell and other items disposed under the indicating plate are not viewed therethrough and that some light is transmitted to thereby exhibit a light transmission which is so large as to contribute to the power generation of the solar cell with the result that the function of the solar timepiece per se is not inhibited. Furthermore, even if the same metallic thin film layer coating is used, various metallic colors can be obtained and the light transmission can be varied by changing the thickness of the metallic thin film layer coating within the above range.

The metallic thin film layer coating may consist of a single metallic thin film layer, or may be a multilayer coating consisting of at least two metallic thin film layers. The use of the multilayer coating consisting of at least two metallic thin film layers enables developing a delicate metallic color which cannot be produced by the use of the single metallic thin film layer.

Further, it is preferred that the metallic thin film layer coating have a portion partially cut off by masking or etching. In this construction, various patterns can be formed to thereby enable increasing a design variation.

The metallic thin film layer coating can be composed of one metal selected from the group consisting of Au, Ag, Al, Cu, Co, Cr, Fe, In, Ni, Pd, Pt, Rh, Sn and Ti or an alloy of at least two metals selected from the above group. Also, the metallic thin film layer coating can consist of a film of any of a nitride, an oxide and a carbide of the above metal or alloy, or can consist of a composite of such items.

Still further, it is preferred that the resin substrate have at least one side thereof at least partially provided with an irregular pattern. This construction enables the same design expression as realized by the conventional indicating plate, extensively increases a design variation inclusive of a tone and pattern with superior-quality appearance and enables developing a delicate hue.

On the other hand, the resin substrate can be composed of a transparent resin or a colored resin. The material of the resin substrate is not particularly limited, and, for example, a polycarbonate resin, an acrylic resin, a polyacetal resin, an ABS resin, a polyethylene resin, a polypropylene resin, a polystyrene resin or a polyethylene terephthalate resin can be used. When the resin substrate is composed of a colored resin, a design variation inclusive of tone can be increased, for example, a texture improvement can be attained by the use of the resin having the same color as that of the metallic thin film layer coating.

Further, the resin substrate may be composed of a blend of different types of resins known as polymer alloy, for example, a polymer alloy consisting of a combination of at least two resins selected from among a polycarbonate resin, an acrylic resin, a polyacetal resin, an ABS resin, a polyethylene resin, a polypropylene resin, a polystyrene resin and a polyethylene terephthalate resin.

The use of the above polymer alloy enables improving the adherence to metallic thin film layer coating, surface treatability, moldability and hygroscopic property of the resin substrate.

It is preferred that the metallic thin film layer coating have its upper surface covered with a surface protective layer. For example, a color coating, a gradation coating or a laminate film can be used as the surface protective layer. The surface protective layer enables not only protecting the metallic thin film layer coating from oxidation, etc. but also effecting, for example, a tone change to thereby increase a design variation.

In particular, when the metallic thin film layer coating provided on the resin substrate is composed of Ag or Cu, the metallic thin film layer coating suffers from discoloration, rust, etc. unless a surface protective layer is present on the surface of the metallic thin film layer coating. Therefore, the formation of the surface protective layer is requisite.

This surface protective layer may be one prepared from a synthetic resin based paint or ink. This paint or ink can be based on an acrylic resin, a urethane resin, an alkyd resin, an epoxy resin or a mixture thereof.

Further, the surface protective layer may be composed of a synthetic resin film such as a polyethylene film or a polyester film.

Still further, the surface protective layer may be composed of a metal oxide coating film. This metal oxide coating film can be formed by, for example, the vacuum deposition of a metal oxide such as MgO, $TiO_2$, $SiO_2$, SiO, $ZrO_2$ or $Al_2O_3$. The formation of the metal oxide coating film on the surface of the resin substrate can be accomplished by the use of not only the above vacuum deposition technique but also other dry plating techniqueisuch as the ion plating or the sputtering technique.

Still further, the surface protective layer can be composed of a chromated coating film comprising as obtained by treating the metallic thin film layer coating with a solution containing chromic acid and a chromic salt to thereby form a chromate coating on the plating. The resin substrate may be embossed to thereby provide surface protrusions constituting time characters or the like. Further, the upper surface of the timepiece indicating plate can be provided with marking by printing. Also, time character or other marking member can be bonded onto the upper surface of the timepiece indicating plate.

Furthermore, it is preferred that the timepiece indicating plate be fitted with means for mounting the timepiece indicating plate on a timepiece frame. The mounting means can be, for example, cuts provided at the periphery of the indicating plate, protrusions provided at the periphery of the indicating plate, holes provided at the periphery of the indicating plate or protrusions provided on the back of the indicating plate.

In all the above constructions, it is preferred that the light transmission of the timepiece indicating plate be in the range of 10 to 50% lest the capability of power generation of the solar cell disposed under the timepiece indicating plate be inhibited.

On the other hand, according to the present invention, there is provided a process for producing an indicating plate for a timepiece to be arranged on a front surface side of a solar cell housed in a timepiece, the timepiece indicating plate comprising a resin substrate through which light can be transmitted and a metallic thin film layer coating formed on at least one side of the resin substrate, which process comprises the steps of:

conducting an injection molding of a resin, followed by punching according to necessity, to prepare a resin substrate; and forming a metallic thin film layer coating on at least one side of the resin substrate by dry plating.

In this process, the dry plating can be conducted by any of the vacuum deposition, ion plating and sputtering techniques. It is preferred that the thickness of the metallic thin film layer coating formed by the dry plating range from 100 to 500 Å. The reason is that the solar cell and other items disposed under the indicating plate are not viewed therethrough and that some light is transmitted to thereby exhibit a light transmission which is so large as to contribute to the power generation of the solar cell with the result that the function of the solar timepiece per se is not inhibited. Furthermore, even if the same metallic thin film layer coating is used, various metallic colors can be obtained and the light transmission can be varied by changing the thickness of the metallic thin film layer coating within the above range.

The employment of the above dry plating, which is a physical method, enables easily executing the coating application to a resin being a nonconductor, especially, only one side thereof as compared with the wet plating or the like. Also, it enables carrying out a film formation while monitoring the film thickness so that precision control of film thickness and massproduction with high reproducibility can be realized.

It is preferred that the injection molding be performed with the use of a metal mold having an irregular pattern provided on its inner surface so that at least one side of the resin substrate is at least partially provided with the irregular pattern. This metal mold can be fabricated by the conventional electrical forming (known as "electroforming") method. The pattern produced by this method is, for example, an electroformed radial pattern or electroformed sandy pattern. The thus constituted process enables the same design expression as realized by the conventional indicating plate, extensively increases a design variation inclusive of a tone and pattern with superior quality appearance and enables developing a delicate hue.

Furthermore, for increasing the adherence between the metallic thin film layer coating and the basis constituting resin substrate and for enhancing the appearance quality and weather resistance reliability of the metallic thin film layer coating, it is preferred that cleaning of the resin substrate on its surfaces be performed prior to the step of forming the metallic thin film layer coating.

This cleaning is preferably accomplished by cleaning with the use of, for example, a neutral detergent to thereby degrease the surface of the resin substrate or remove particles or dust or by the method known as ion bombardment (ion bombarding method) in which moisture and residual gas molecules such as $CO_2$, CO and $H_2$ are removed from the surface of the resin substrate by the impact of inert gas ions.

Also, the above cleaning is preferably performed by heating the resin substrate so that moisture and residual gas molecules are removed. This heating is preferably performed in a reduced pressure, still preferably, in a vacuum.

Still further, the above step of forming the metallic thin film layer coating preferably includes masking and etching conducted to form a metallic thin film layer having partially cut off portion. Specifically, use can be made of a method in which the metallic thin film coating is formed in multilayers as permitted from the viewpoint of transmitted light quantity, the multilayer coating is provided with a masking of, for example, a photoresist and an upperlayer metal is partially removed by etching. In addition, a method in which, contrarily, the masking is first provided, subsequently the metallic thin film layer coating is formed and thereafter the topmost metallic thin film layer is removed together with the masking material can be used.

As a result, a design variation can be increased by a combination of various colors, namely, a combination of the metallic color of the topmost metallic thin film layer, the metallic color of the underlying metallic thin film layer and, if the resin substrate is colored, the color thereof.

It is preferred that the process comprise the step of covering the upper surface of the metallic thin film layer coating with a surface protective layer. For example, a color coating, a gradation coating or a laminate film can be used as the surface protective layer. The covering with the surface protective layer enables not only protecting the metallic thin film layer coating from oxidation, etc. but also effecting, for example, a tone change to thereby increase a design variation.

In particular, when the metallic thin film layer coating provided on the resin substrate is composed of Ag or Cu, the metallic thin film layer coating suffers from discoloration, rust, etc. unless a surface protective layer is present on the surface of the metallic thin film layer coating. Therefore, the formation of the surface protective layer is requisite.

This surface protective layer may be prepared from a synthetic resin based paint or ink. This paint or ink can be based on an acrylic resin, a urethane resin, an alkyd resin, an epoxy resin or a mixture thereof.

Further, the surface protective layer may be composed of a synthetic-resin film such as a polyethylene film or a polyester film.

Still further, the surface protective layer may be composed of a metal oxide coating film. This metal oxide coating film can be formed by, for example, the vacuum deposition of a metal oxide such as MgO, $TiO_2$, $SiO_2$, SiO, $ZrO_2$ or $Al_2O_3$. The formation of the metal oxide coating film on the surface of the resin substrate can be accomplished by the use of not only the above vacuum deposition techniques but also other dry plating technique such as the ion plating or the sputtering technique.

Still further, the surface protective layer can be composed of a chromated coating film as obtained by treating the metallic thin film layer coating with a solution containing chromic acid to thereby form a chromate coating on the plating.

The process may comprise the step of embossing the resin substrate so that surface protrusions constituting time characters or the like are provided, prior to the step of forming the metallic thin film layer coating.

Further, it is preferred that the process comprise the finishing step of providing the upper surface of the timepiece indicating plate with marking by printing or with a marking member such as a time character by bonding.

Furthermore, it is preferred that, in the injection molding, the timepiece indicating plate be fitted with means for mounting the timepiece indicating plate on a timepiece frame by monolithic molding. The mounting means can be, for example, cuts provided at the periphery of the indicating plate, protrusions provided at the periphery of the indicating plate, holes provided at the periphery of the indicating plate or protrusions provided on the back of the indicating plate.

DESCRIPTION OF THE PREFRERRED EMBODIMENTS

Embodiments of the present invention will be described below with reference to the drawings.

Embodiment 1

Figure 1:
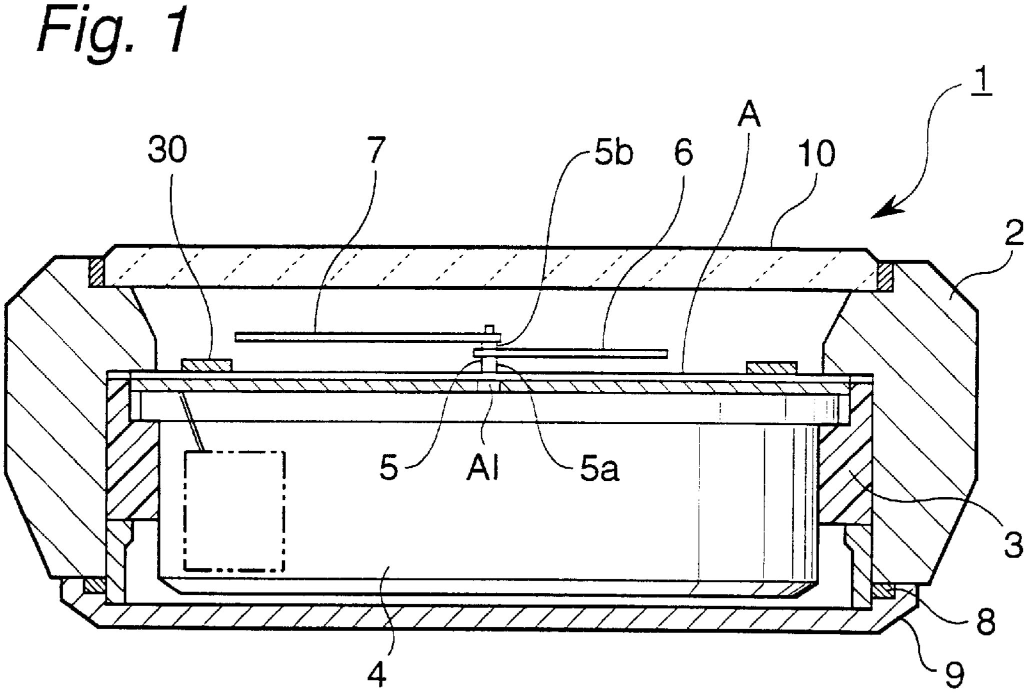
FIG. 1 is a sectional view of a wristwatch equipped with the timepiece indicating plate according to the first embodiment of the present invention.
Figure 2:
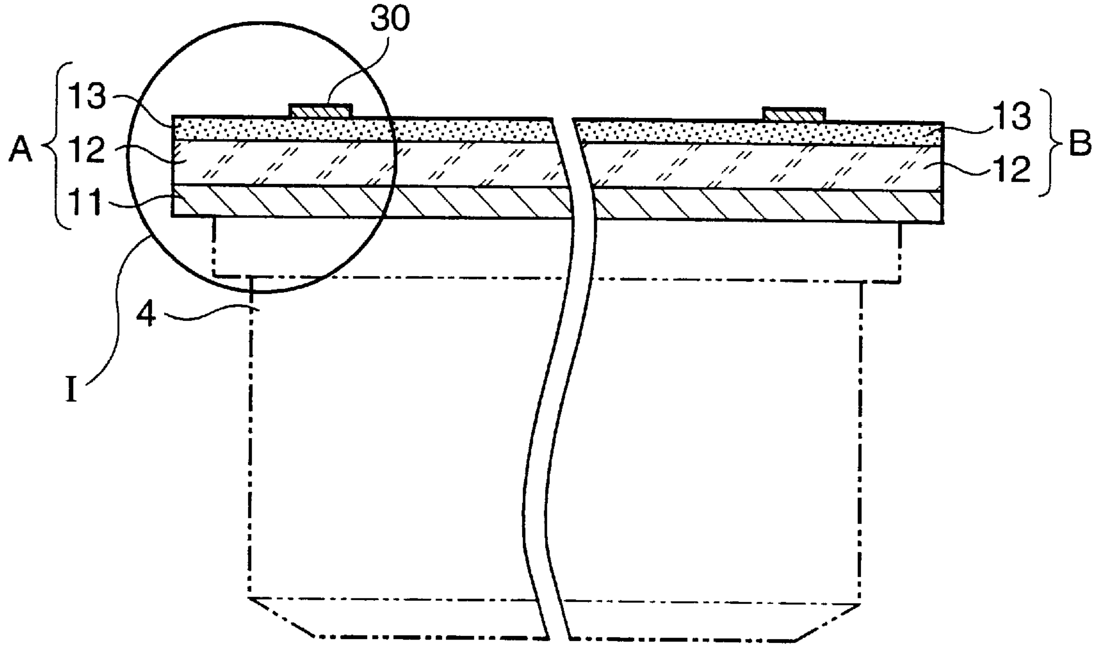
FIG. 2 is a sectional view of an indicating plate structure for solar timepiece equipped with the timepiece indicating plate according to the first embodiment of the present invention.

FIG. 1 is a sectional view of a wristwatch equipped with the timepiece indicating plate according to the first embodiment of the present invention; FIG. 2 is a sectional view of an indicating plate structure for solar timepiece equipped with the timepiece indicating plate according to the first embodiment of the present invention; and FIG. 3 is an enlarged view of portion I of FIG. 2.

Referring to FIG. 1, module 4 is fixed by means of support frame 3 of a synthetic resin, fitted in an internal part of outer barrel 2. Indicating plate structure for solar timepiece A is provided on a front side of the module 4. Hand axle 5 of a double axle construction provided on the module 4 is arranged through central hole Al made in the indicating plate structure for solar timepiece A. Outer axle **5*a* and inner axle 5*b* of the hand axle 5 are fitted with hour hand 6 and minute hand 7, respectively. Further, back lid 9 is secured through waterproof packing 8 to the bottom side of the outer barrel 2, and windshield glass 10 is secured through a waterproof ring (Teflon® resin) to the front side of the outer barrel 2, thereby constituting wristwatch 1**.

The indicating plate structure for solar timepiece A consists essentially of solar cell 11 secured to a front side of the module 4 and indicating plate for timepiece B disposed on a front side of the solar cell 11 (same as in the following embodiments) as shown in FIG. 2.

Figure 3:
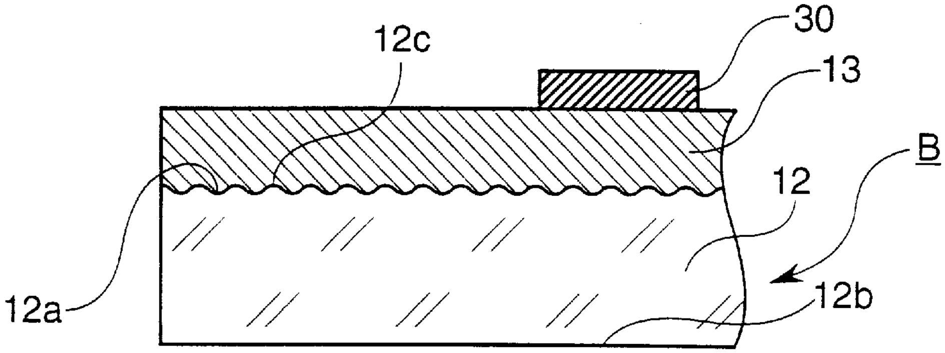
FIG. 3 is an enlarged view of portion I of FIG. 2.
Figure 23:
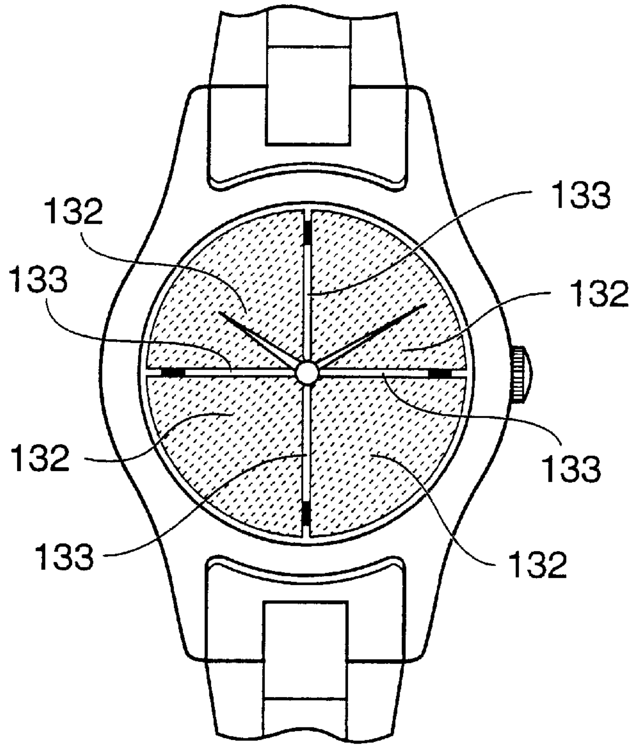
FIG. 23 is a plan view of a wristwatch equipped with the conventional indicating plate structure for solar timepiece.
Figure 24:
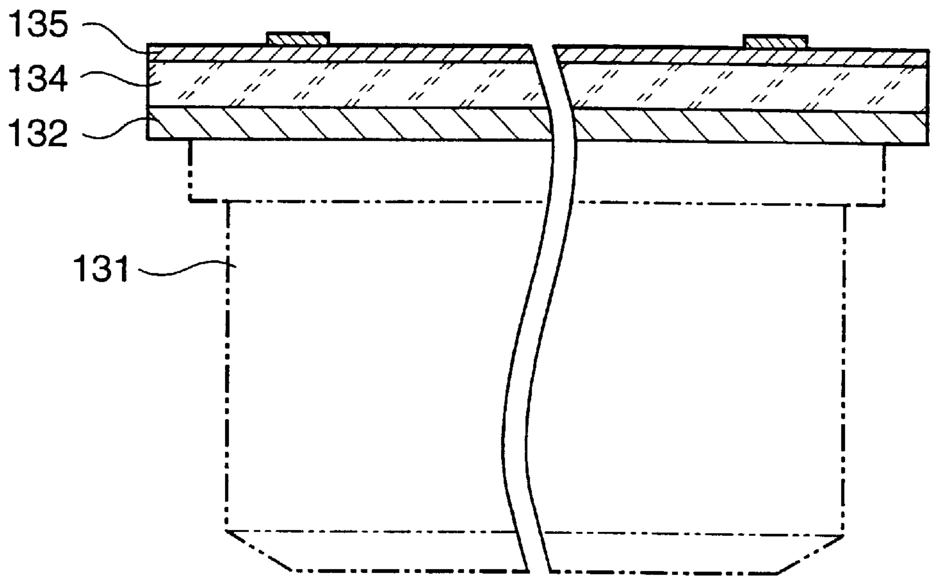
FIG. 24 is a sectional view of the conventional indicating plate structure for solar timepiece.

The timepiece indicating plate B, as shown in FIGS. 2 and 3, is constructed of resin substrate (dial base material) 12 composed of a resin through which light can be transmitted and metallic thin film layer 13 disposed on front side (light incident side) **12*a* of the resin substrate 12. The metallic thin film layer 13 has its surface provided with preselected print/time character 30 by printing, bonding of a marking member, embedding caulking or otherwise mounting (in all the following embodiments, although the print/time character 30 is not particularly mentioned, it is disposed on the topmost layer without exception). As shown in FIG. 23 for the prior art, the solar cell 11 is fan-shaped in plan form, and four solar cells 11** are arranged with insulating bands interposed therebetween.

The surface of the front side (light incident side) **12*a* of the resin substrate 12 is at least partially provided with pattern 12*c* of minute irregularity of about tens of nanometers to about hundreds of microns. This enables the same design expression as realized by the conventional indicating plate, so that a pattern with superior-quality appearance can be formed. The above pattern 12*c*** is, for example, a radial pattern, a sandy pattern, a natural shell pattern, a polished peculiar surface or a holograph.

The formation of the above pattern can be accomplished by fabricating an injection molding metal mold having an irregular pattern, such as an electroformed radial pattern or an electroformed sandy pattern, provided on its inner surface by the conventional electrical forming (known as "electroforming") method and transferring this irregular pattern onto the resin substrate by injection molding. Naturally, the formation of the pattern can also be accomplished by the conventional method such as mechanical graining or forging.

The resin for constituting the resin substrate 12 is not particularly limited, and, for example, a polycarbonate resin, an acrylic resin, a polyacetal resin, an ABS resin, a polyethylene resin, a polypropylene resin, a polystyrene resin or a polyethylene terephthalate resin can be used. The resin substrate 12 can be produced by performing an injection molding and a contour punching into a given dimension corresponding to the size of wristwatch. The thickness of the resin substrate 12 is preferably in the range of 300 to 500 $\mu$m.

Further, the resin substrate 12 may be composed of a blend of different types of resins known as polymer a alloy, for example, a polymer alloy consisting of a combination of at least two resins selected from among a polycarbonate resin, an acrylic resin, a polyacetal resin, an ABS resin, a polyethylene resin, a polypropylene resin, a polystyrene resin and a polyethylene terephthalate resin.

The blended resin ratio can appropriately be changed taking the moldability, surface treatability with metal plating or the like, hygroscopicity, etc. into account and is not particularly limited. For example, when a polycarbonate resin is used as a principal component resin and an ABS resin is used as a subsidiary resin, the ABS resin ratio is, for example, 20% by weight based on the weight of the principal component resin because of the exertion of the surface treatability and moldability of the ABS resin, which, however, can appropriately be varied. For example, "Diaalloy (trade name)" produced by Mitsubishi Rayon Co., Ltd. can be used as the polymer alloy. In the use of this resin as well, the resin substrate can be produced by performing an injection molding and a contour punching into given dimension corresponding to the size of wristwatch. The thickness of the resin substrate is preferably in the range of 300 to 500 $\mu$m.

The employment of the above polymer alloy enables enhancing the adhesion with metallic thin film layer 13, surface treatability, moldability, hygroscopicity, etc. of the resin substrate.

It is preferred that mirror polishing (specular finishing) by, for example, buffing be applied to surface 12*b* of the resin substrate 12 on its side of solar cell 11. The reason is that incident light transmitted through the resin substrate 12 and heading toward the solar cell is prevented from undergoing irregular reflection at the interface of the resin substrate 12 and the solar cell to thereby cause such a diffusion that power generating capability of the solar cell is deteriorated.

The metallic thin film layer 13 is preferably formed on the resin substrate 12 by dry plating. In the dry plating, any of the vacuum deposition, ion plating and sputtering techniques can be used. The employment of the above dry plating, which is a physical method, enables easily executing the coating application to a resin being a nonconductor, especially, only one side thereof as compared with the wet plating or the like. Further, it enables carrying out a film formation while monitoring the film thickness so that precision, control of film thickness and mass producron with high reproducibility can be realized.

Although the thickness of the metallic thin film layer 13 can appropriately be set taking the light transmission, etc. into account, it is preferred that the metallic thin film layer 13 have a thickness of 100 to 500 Å. The reason is that the solar cell 11 and other items disposed under the indicating plate are not viewed therethrough and that some light is transmitted to thereby exhibit a light transmission which is so large as to contribute to the power generation of the solar cell with the result that the function of the solar timepiece per se is not inhibited. That is, when the thickness of the metallic thin film layer 13 is smaller than 100 Å, the solar cell and other items are viewed through the indicating plate. On the other hand, when the thickness is greater than 500 Å, the light transmission is so low that the energizing of the solar cell is rendered difficult. Even if the same metallic thin film layer is used, various metallic colors can be obtained and the light transmission can be varied by changing the thickness of the metallic thin film layer within the above range. For example, in the use of gold, a change from a reddish gold color to golden yellow occurs in accordance with the increase of the thickness of the metallic thin film layer.

Figure 18:
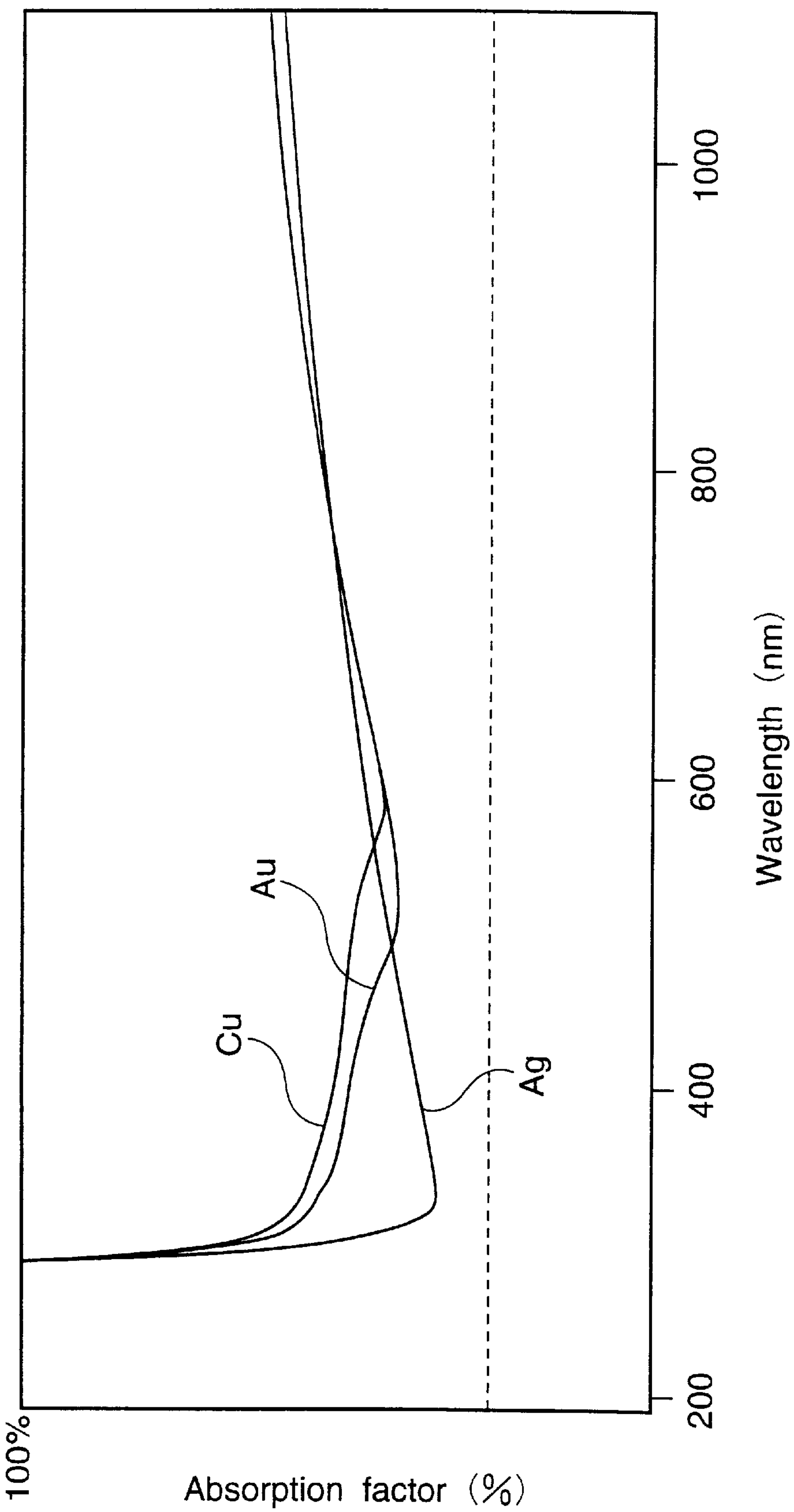
FIG. 18 is a graph showing the relationship between wavelength and absorptivity.

As apparent from the following Tables 1 and 2, the thickness and the light transmission of the metallic thin film layer 13 increase or decrease in an exponential relationship, irrespective of the type of the metal. That is, the smaller the thickness of the coating film, the greater the light transmission, and, the greater the thickness of the coating film, the lower the light transmission. Further, even at the same thickness, the light transmission is peculiar to each type of metal. For example, although Tables 1 and 2 show that the light transmissions of gold (Au) and silver (Ag) are comparable with each other, actually, the absorption factor of silver is lower than that of gold at 350 to 500 nm within the wavelength region which is effective in the energizing of the solar cell as apparent from the graph of FIG. 18 showing the relationship between wavelength and absorption factor. Namely, the light transmission of silver is greater than that of gold so that the large surface reflection of silver is compensated for.

TABLE 1

| Light Transmission/Thickness of Gold Vacuum Deposition Coating And Solar Cell Viewability/Appearance | | | | |
|---|---|---|---|---|
| Transmission (%) | Thickness (Å) | Sandy pattern | Radial pattern | Overall evaluation |
| 60 | 90 | X | X | Cell viewed; not usable |
| 55 | 110 | X | X | Cell viewed; not usable |
| 50 | 135 | X~Δ | X | Usable |
| 45 | 160 | Δ | X~Δ | Usable |
| 40 | 185 | Δ | Δ | Suitable for use |
| 35 | 215 | Δ~○ | Δ | Suitable for use |
| 30 | 255 | ○ | Δ~○ | Suitable for use |
| 25 | 295 | ◎ | ○ | Most suitable for use |
| 20 | 345 | ◎ | ◎ | Most suitable for use |
| 15 | 410 | ◎ | ◎ | Most suitable for use |
| 10 | 505 | ◎ | ◎ | Usable; lower limit of transmission |
| 5 | 670 | ◎ | ◎ | Transmission insufficient; not usable |

Note:
X: Cross lines of underlying solar cell viewed; not usable.
Δ: Cross lines not viewed; usable for most patterns; not usable for specified patterns because cell viewed depending on angle.
○: Solar cell not conspicuous; usable for all patterns.
◎: Solar cells not viewed; tone of metal per se exhibited.

TABLE 2

Light Transmission/Thickness of Silver Vacuum Depositior Coating And Solar Cell Viewability/Appearance

| Transmission (%) | Thickness (Å) | Sandy pattern | Radial pattern | Overall evaluation |
|---|---|---|---|---|
| 60 | 75 | X | X | Cell viewed; not usable |
| 55 | 95 | X | X | Cell viewed; not usable |
| 50 | 115 | X~Δ | X | Usable |
| 45 | 135 | Δ | Δ | Suitable for use |
| 40 | 160 | Δ | Δ | Suitable for use |
| 35 | 190 | Δ~○ | Δ | Suitable for use |
| 30 | 225 | ○ | Δ~○ | Suitable for use |
| 25 | 265 | ◎ | ○ | Most Suitable for use |
| 20 | 310 | ◎ | ◎ | Most Suitable for use |
| 15 | 370 | ◎ | ◎ | Most Suitable for use |
| 10 | 455 | ◎ | ◎ | Usable; lower limit of transmission |
| 5 | 600 | ◎ | ◎ | Transmission insufficient; not usable |

Note:
X: Cross lines of underlying solar cell viewed; not usable.
Δ: Cross lines not viewed; usable for most patterns; not usable for specified patterns because cell viewed depending on angle.
○: Solar cell not conspicuous; usable for all patterns.
◎: Solar cells not viewed; tone of metal per se exhibited.

The metallic thin film layer 13 can be composed of one metal selected from the group consisting of Au, Ag, Al, Cu, Co, Cr, Fe, In, Ni, Pd, Pt, Rh, Sn and Ti or an alloy of at least two metals selected from the above group. For example, Au—Ag, Au—Cu, Au—Ni, Ag—Pd, Au—Al, Cu—Al, Au—Cr, Au—Co, Au—In or Pd—Ni can be used as a binary alloy, and Au—Cu—Pd, Au—Ag—Cu or Au—In—Co can be used as a ternary alloy. The use of this binary or ternary alloy enables producing various metallic colors which cannot be exhibited by any single metal, thereby increasing a design variation. For example, Au—Ag alloy exhibits a yellow gold color, and Au—Cu alloy exhibits a red gold color.

In particular, when the metallic thin film layer 13 provided on the resin substrate 12 is composed of Ag or Cu, the metallic thin film layer 13 suffers from discoloration, rust, etc. unless a surface protective layer is present on the surface of the metallic thin film layer 13. Therefore, the formation of the surface protective layer is requisite.

This surface protective layer may be prepared from a synthetic resin based paint or ink. This paint or ink can be based on an acrylic resin, a urethane resin, an alkyd resin, an epoxy resin or a mixture thereof. The formation of the surface protective layer from the above paint or ink can be performed by, for example, the screen printing, pad printing or coating. It is preferred that the thickness thereof be in the range of 5 to 15 μm, especially, 10 μm, from the viewpoint of the surface protective capability for the metallic thin film layer 13 and the light transmission, etc.

Further, the surface protective layer may be prepared from a synthetic resin film such as a polyethylene film or a polyester film.

The formation of the synthetic resin film layer on the upper surface of the metallic thin film layer 13 can be accomplished by attaching the synthetic resin film layer to the upper surface of the metallic thin film layer 13 by means of an adhesive such as that of an acrylic resin, or by melt extruding a resin such as polyethylene or polyester onto the upper surface of the metallic thin film layer 13 to thereby execute a lamination. It is preferred that the thickness of the synthetic resin film layer be in the range of 10 to 200 μm, especially, 30 to 60 μm, from the viewpoint of the surface protective capability for the metallic thin film layer 13 and the light transmission, etc.

Still further, the surface protective layer may be composed of a metal oxide coating film. This metal oxide coating film can be formed by, for example, the vacuum deposition of a metal oxide such as MgO, $TiO_2$, $SiO_2$, SiO, $ZrO_2$ or $Al_2O_3$. In the vacuum deposition, it is preferred that the pressure inside the chamber of the vacuum deposition apparatus be in the range of $1\times10^{-6}$ to $5\times10^{-5}$ torr ($1.33\times10^{-4}$ to $6.65\times10^{-3}$ Pa). It is preferred that the thickness of the metal oxide coating film be in the range of 500 to 10,000 Å, especially, 1000 to 5000 Å, from the viewpoint of the light transmission, protecting capability as a protective film, and mechanical strength, etc. Namely, when the thickness is smaller than 500 Å, the protecting capability as a protective film is not satisfactory. On the other hand, when the thickness is greater than 10,000 Å, the coating film becomes brittle and the mechanical strength is poor.

The formation of the metal oxide coating film on the surface of the resin substrate 12 can be accomplished by the use of not only the above vacuum deposition technique but also other dry plating techniques such as the ion plating or the sputtering technique.

Still further, the surface protective layer can be composed of a chromated coating film as obtained by treating the metallic thin film layer with a solution containing chromic acid and a chromic salt to thereby form a chromate coating on the plating. For example, when the metallic thin film layer is composed of aluminum, a coating of an oxide containing chromic chromate is formed to thereby realize excellent corrosion resistance and adherence. Also, the chromating can be performed on the metallic thin film layer composed of copper, Ag, etc., thereby attaining the same corrosion resistance improvement as effected on the metallic thin film layer of aluminum.

The above chromating can be performed by an immersion at ordinary temperature in a 1 to 3% solution, as obtained by adding sulfuric acid or nitric acid to a chromate such as $K_2Cr_2O_7$ or $Na_2Cr_2O_7$ and chromic acid such as $Cr_2O_3$, for 10 to 60 sec to thereby form a chromate coating.

It is preferred that the light transmission of the thus constructed timepiece indicating plate be in the range of 10 to 50%. When the light transmission which contributes to the power generation of the solar cell falls in this range, the power generation of the solar cell is not inhibited with the result that the timepiece constantly operates without stopping.

The light transmission is generally determined from the quantity of power generated by the solar cell from light transmitted through the dial for solar cell timepiece. That is, the solar cell placed at a given distance from a light source in an apparatus constructed so as to inhibit penetration of external light is irradiated with light to convert light energy to electric energy, thereby obtaining electric current designated $A_0$. The dial for the solar cell timepiece is mounted on the above solar cell, and the same measurement is carried out, thereby obtaining electric current designated $A_1$ The light transmission is expressed as a percentage of $A_1$ to $A_0$ (same in the following embodiments).

Figure 19:
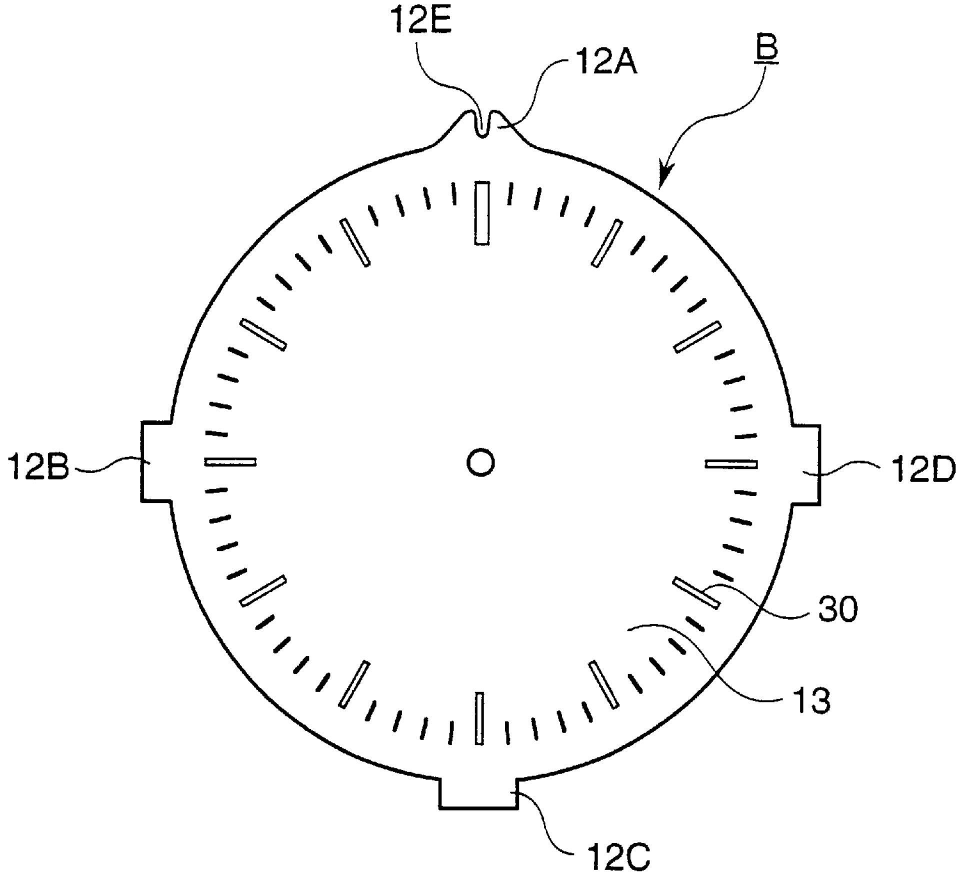
FIG. 19 is a plan view of the timepiece indicating plate according to the first embodiment of the present invention.
Figure 20:
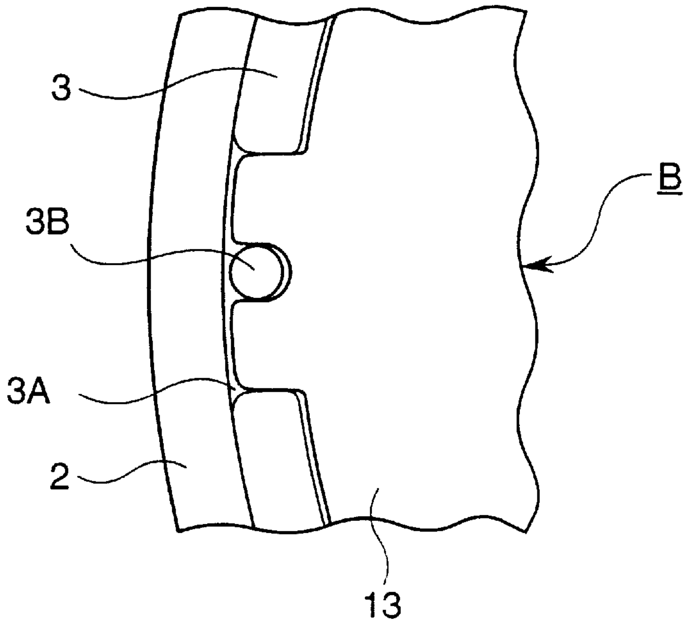
FIG. 20 is a sectional view explaining the timepiece indicating plate according to the first embodiment of the present invention being placed in a fixed state.

As shown in FIG. 19, it is preferred that the timepiece indicating plate B be fitted with means for mounting and fixing the timepiece indicating plate B on a timepiece frame. That is, substantially rectangular protrusions 12A to 12D are formed at symmetrical positions of the periphery of the timepiece indicating plate B. These protrusions 12A to 12D are fitted in recesses 3A provided in an upper part of support frame 3, as shown in FIG. 20, so that desired fixing is attained. In this instance, the upper surface of the timepiece indicating plate B and the upper surface of the support frame 3 lie in approximately the same plane. In this embodiment, front edge of protrusion 12A as one of the protrusions 12A to 12D is provided with notch 12E for positioning. This notch 12E is fitted to projecting part 3B for positioning provided in one of the recesses 3A of the support frame 3, so that the positioning is attained.

Figure 21:
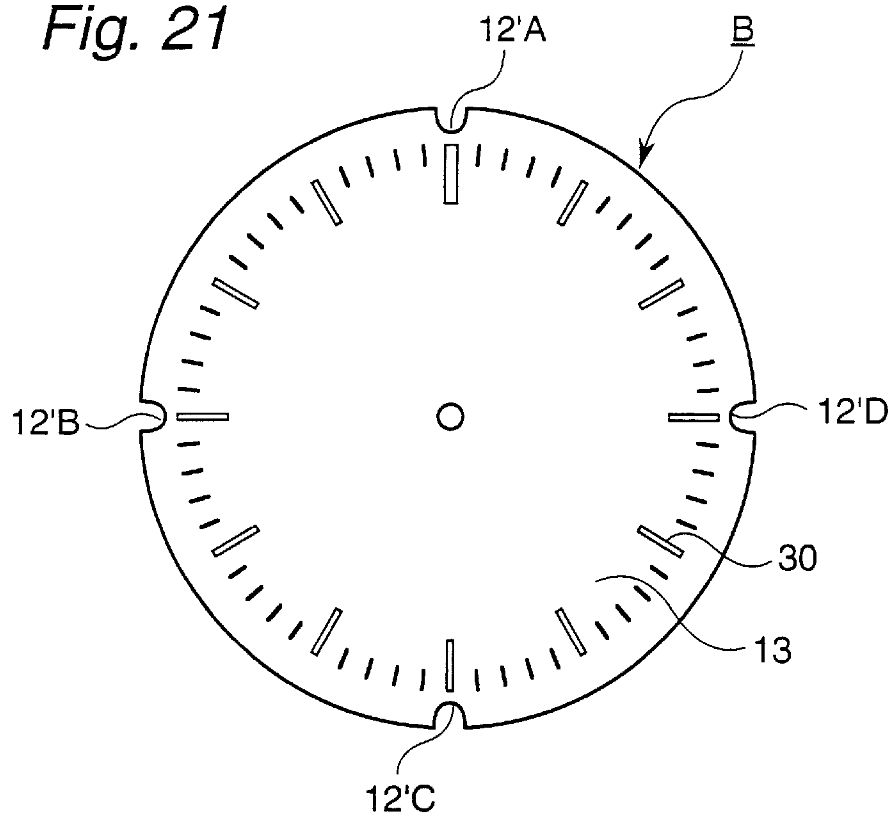
FIG. 21 is a plan view of another form of fixing part of the timepiece indicating plate according to the first embodiment of the present invention.
Figure 22:
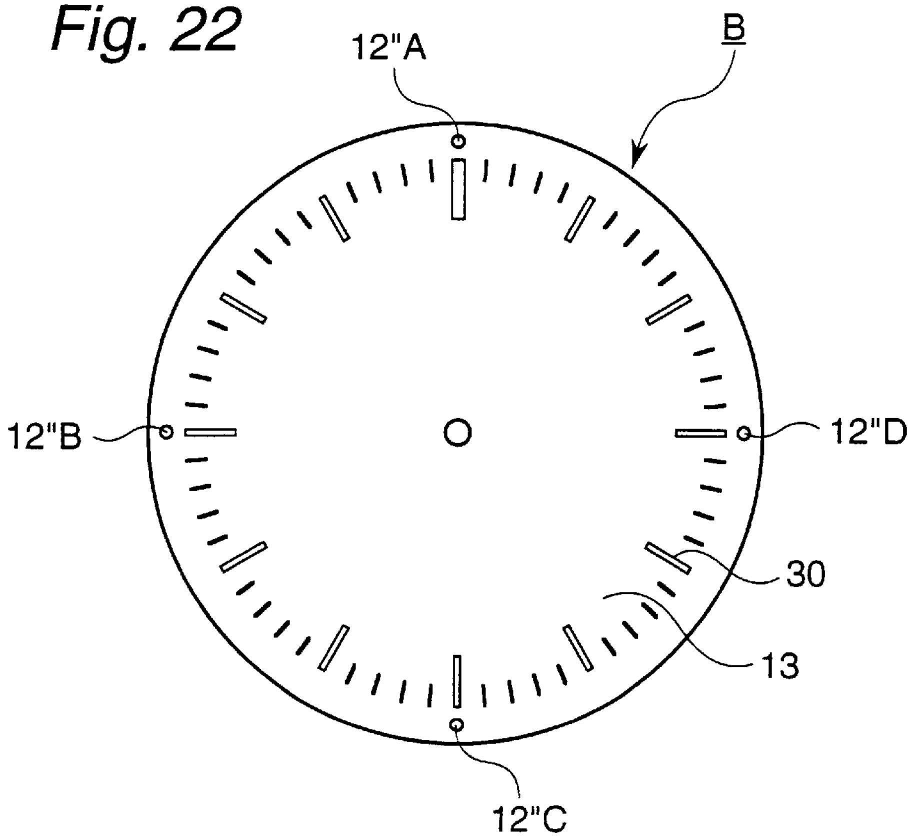
FIG. 22 is a plan view of still another form of fixing part of the timepiece indicating plate according to the first embodiment of the present invention.

In place of the above protrusions 12A to 12D, the fixing of the timepiece indicating plate B to the timepiece frane can be accomplished by such a construction that, referring to FIG. 21, substantially semicircular notches 12'A to 12'D are formed at symmetrical positions on the periphery of the timepiece indicating plate B, these notches 12'A to 12'D fitted to projecting parts (not shown) provided in corresponding relationship on the support frame 3 so that desired fixing is attained. Further, the fixing of the timepiece indicating plate B to the timepiece frame can be accomplished by such a construction that, referring to FIG. 22, substantially circular holes 12"A to 12"D are formed at symmetrical positions in the vicinity of the periphery of the timepiece indicating plate B, these holes 12"A to 12"D fitted to projecting parts (not shown) provided in corresponding relationship on the front side of module 4 so that desired fixing is attained. Still further, although not shown, the fixing of the timepiece indicating plate B to the timepiece frame can be accomplished by furnishing the back of the timepiece indicating plate B with small columnar protrusions by monolithic molding and fitting these projections to recesses (not shown) provided in corresponding relationship on the front side of the module 4 so that desired fixing is attained. In this embodiment, although only one is selected from among the protrusion, notch and hole and used, at least two may be selected from among the same and used. Also, although four protrusions, notches or holes are arranged at symmetrical positions, the number thereof may be at least two in the present invention. In this instance, the protrusions, notches or holes may be arranged at asymmetrical positions.

These mounting members are similarly used in the following embodiments.

The practical process for producing the timepiece indicating plate B of this Embodiment 1 will be described below.

An injection molding metal mold having an irregularity pattern, such as an electroformed sandy pattern, provided on its inner surface is fabricated by the electroforming method. Injection molding of a resin such as a polycarbonate is performed with the use of this injection molding metal mold to thereby produce a resin substrate 12 having a surface to which pattern 12*c* of irregularity of about tens of nanometers to about hundreds of microns have been transferred. According to employed design, a contour punching is performed to thereby obtain the resin substrate 12.

Thereafter, the surface of the resin substrate 12 is cleaned for increasing the adherence between the metallic thin film layer 13 and the basis constituting resin substrate 12 and for enhancing the appearance quality and weather resistance reliability of the metallic thin film layer.

This cleaning is accomplished, for example, with the use of a neutral detergent to thereby degrease the surface of the resin substrate or remove particles or dust therefrom.

According to necessity, the cleaning known as ion bombardment (ion bombarding method) can be performed in which moisture and residual gas molecules such as $CO_2$, CO and $H_2$ are removed from the surface of the resin substrate by the impact of inert gas ions. This ion bombardment can be performed, for example, by arranging the resin substrate 12 as a cathode, together with an appropriate counter electrode, in a chamber, evacuating the chamber to a vacuum of $10^{-3}$ to $10^{-1}$ torr, applying a voltage of hundreds to thousands of volts and introducing air or Ar gas.

Also, for the same purpose, the resin substrate is preferably heated to thereby remove moisture and residual gas molecules. This heating is preferably performed in a reduced pressure, still preferably, in a vacuum. It is preferred that the heating be performed at a temperature close to the heat resistant upper limit temperature of polycarbonate which is 130° C., especially, ranging from to 80 to 100° C., although depending on the type of the resin of the resin substrate, in a vacuum of $10^{-3}$ to $10^{-5}$ torr.

Subsequently, for forming the metallic thin film layer 13 on the surface 12*a* of the resin substrate 12, the resin substrate 12 is set in a vacuum deposition apparatus and the vacuum deposition as a dry plating is performed. In the vacuum deposition, it is preferred that the pressure inside the chamber of the vacuum deposition apparatus be in the range of $1\times10^{-6}$ to $5\times10^{-5}$ torr ($1.33\times10^{-4}$ to $6.65\times10^{-3}$ Pa). The thickness of the metallic thin film layer 12 can arbitrarily be set within the range of 100 to 500 Å, taking into account the metallic color required in design and the quantity of transmitted light required for the energizing of the solar cell. The formation of the metallic thin film layer 13 on the surface of the resin substrate 12 can be accomplished by the use of not only the above vacuum deposition technique but also other dry plating techniques such as the ion plating or the sputtering technique.

In this embodiment, an injection molding of a resin has been carried out with the use of an injection molding metal mold having an irregular pattern such as electroformed sandy pattern provided on its inner surface. By this injection molding, the irregular pattern 12*c* is transferred to the surface of the resin substrate 12. However, although not very practical because of the increase of the number of process steps which invites a cost increase and renders the quality of the metallic thin film layer unstable, the following mechanical or physical working can be used in place of the furnishing of the surface of the resin substrate 12 with the pattern 12c at the injection molding. Namely, it is naturally feasible to apply a mechanical working, such as patterning with the use of, for example, a brush of a metal or resin, to the surface of the metallic thin film layer 13 provided by vacuum deposition whilst it is very thin. Also, it is naturally feasible to apply to the surface of the metallic thin film layer 13 a physical working, such as that known as "liquid honing" in which an abrasive powder such as alumina is dispersed in a liquid and the liquid is blown by air pressure so that the metal surface is furnish with an irregular pattern and that a gloss regulation is conducted to thereby attain a texture change.

Basically the same procedure for manufacturing a timepiece indicating plate as described above is employed in the following embodiments-specifically, for example, the manufacturing of the timepiece indicating plate was carried out as follows.

An injection molding metal mold having an electroformed sandy pattern provided on its inner surface was fabricated by the electroforming method. Injection molding of a polycarbonate was performed with the use of this injection molding metal mold to thereby prepare a resin substrate having a surface to which the electroformed sandy pattern was transferred. The surface of this resin substrate was cleaned (cleaning by surface degreasing, cleaning using a neutral detergent or, according to necessity, cleaning by ion bombardment (ion bombarding method)) (same in the following embodiments). The resultant resin substrate was heated under a pressure of $5 \times 10^{-6}$ torr, and the vacuum deposition of gold was performed. Thus, five varieties of timepiece indicating plates were obtained which exhibited respective light transmissions (thicknesses) of 50% (135 Å), 35% (215 Å) 25% (295 Å), 15% (410 Å) and 10% (500 Å).

The five varieties of timepiece indicating plates were incorporated in solar timepieces. The tone thereof, etc. were as follows.

With respect to the timepiece indicating plate whose light transmission and thickness were 50% and 135 Å, respectively, the tone thereof was reddish, the cross lines of the solar cell could not be perceived and the solar cell tone viewability was within a practical range. With respect to the timepiece indicating plate whose light transmission and thickness were 35% and 215 Å, respectively, the tone thereof was slightly reddish, the tone of the solar cell was not conspicuous and use could be made for almost all patterns. With respect to the timepiece indicating plate whose light transmission and thickness were 25% and 295 Å, respectively, the tone thereof was slightly reddish, the solar cell was entirely invisible, the appearance was optimal and it was most suitable for the energizing of the solar cell. With respect to the timepiece indicating plate whose light transmission and thickness were 15% and 410 Å, respectively, the tone thereof was completely golden, the solar cell was entirely invisible, the appearance thereof was optimal and it was most suitable for the energizing of the solar cell. With respect to the timepiece indicating plate whose light transmission and thickness were 10% and 500 Å, respectively, the tone thereof was completely golden, the solar cell was entirely invisible and it was suitable for the energizing of the solar cell.

Embodiment 2

Figure 4:
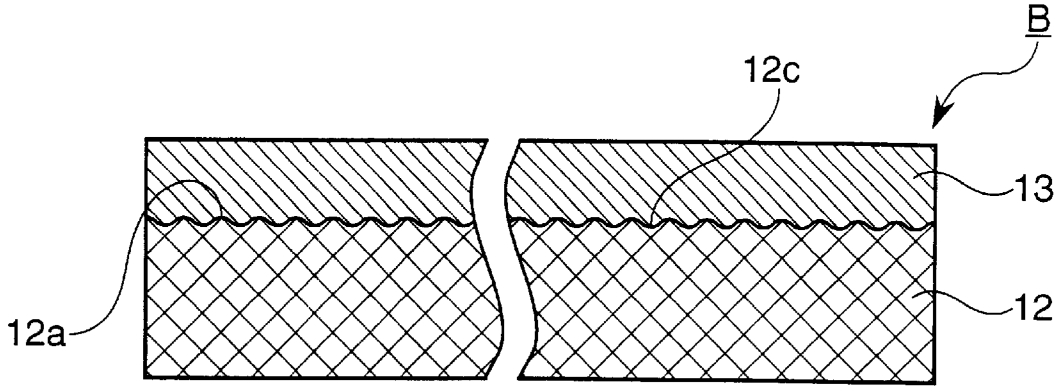
FIG. 4 is a sectional view of the timepiece indicating plate according to the second embodiment of the present invention.

FIG. 4 is a sectional view of the timepiece indicating plate according to the second embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is provided with minute irregularity pattern 12*c*. However, the timepiece indicating plate B of this Embodiment is different from that of Embodiment 1 in that a blend of different types of resins known as polymer alloy is used in the resin substrate 12. Thus, with respect to the same features as in Embodiment 1, the description thereof is omitted below.

In the resin substrate 12, a blend of different types of resins known as polymer alloy, for example, a polymer alloy consisting of a combination of at least two resins selected from among a polycarbonate resin, an acrylic resin, a polyacetal resin, an ABS resin, a polyethylene resin, a polypropylene resin, a polystyrene resin and a polyethylene terephthalate resin, can be used.

The blended resin ratio can appropriately be changed by taking the moldability, surface treatability with metal plating or the like, hygroscopicity, etc. into account and is not particularly limited. For example, when a polycarbonate resin is used as a principal component resin and an ABS resin is used as a subsidiary resin, the ABS resin ratio is, for example, 20% by weight based on the weight of the principal component resin because of the exertion of the surface treatability and moldability of the ABS resin, which, however, can appropriately be varied. For example, "Diaalloy (trade name)" produced by Mitsubishi Rayon Co., Ltd. can be used as the polymer alloy.

In the use of this resin, the resin substrate can be produced by performing an injection molding and a contour punching into given dimension corresponding to the size of wristwatch. The thickness of the resin substrate is preferably in the range of 300 to 500 μm.

The employment of the above polymer alloy enables enhancing the adhesion with metallic thin film layer 13, surface treatability, moldability, hygroscopicity, etc. of the resin substrate.

Specifically, for example, the manufacturing of the timepiece indicating plate of this Embodiment was carried out as follows.

A polycarbonate resin was blended with an ABS resin at a weight percent ratio of 1:1 and pelletized. The obtained pellets were injection molded into resin substrate 12 of polymer alloy furnished with electroformed sandy pattern in the same manner as in Embodiment 1. The light transmission of this resin substrate 12 was 70%. Thereafter, the surface of the resin substrate was cleaned, and the same vacuum deposition as in Embodiment 1 was performed so that the front side surface of the resin substrate was furnished with a vacuum deposition coating of Au with 250 Åthickness (light transmission exhibited when the vacuum deposition was performed on the surface of a transparent resin substrate: 21.5%). Thus, the metallic thin film layer 13 was formed, thereby obtaining a timepiece indicating plate.

The obtained timepiece indicating plate was assembled in a solar timepiece. The tone was reddish and the sandy pattern was observed. The solar timepiece was full of an appearance of superior quality. The brown or dark-blue solar cell and the insulating band cross lines were not viewed through the indicating plate. The light transmission of the timepiece indicating plate was 20%, which was satisfactory for the energizing of the solar cell.

Embodiment 3

Figure 5:
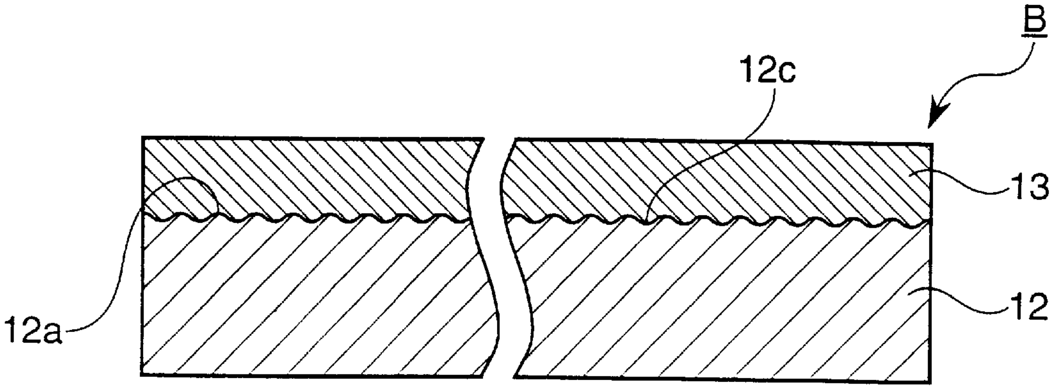
FIG. 5 is a sectional view of the timepiece indicating plate according to the third embodiment of the present invention.

FIG. 5 is a sectional view of the timepiece indicating plate according to the third embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that the resin substrate 12 is colored by the addition of a colorant such as a pigment or a dye. Thus, with respect to the same features as in Embodiments 1 and 2, the description thereof is omitted below.

For example, when the metallic thin film layer 13 is composed of silver, the whiteness of the silver tone can be increased by the addition of a white pigment such as titanium oxide to the resin substrate. Thus, the tone of metallic color can be diversified.

The resin substrate 12 containing a pigment or dye can be prepared by mixing a dye or pigment in a transparent resin such as an acrylic resin or a polycarbonate (polycarbonic ester) resin, pelletizing the mixture and conducting an injection molding of the pellets into given dimension, for example, a thickness of 300 to 500 μm. Although the ratio of mixed dye or pigment can arbitrarily be set depending on the tone and the light transmission, the use of too much dye or pigment unfavorably lowers the light transmission, so that it is preferred that the dye or pigment be used in an amount of 0.001 to 1.0% by weight, especially, 0.005 to 0.5% by weight and, still especially, 0.01 to 0.1% by weight based on the transparent resin. With respect to the type of employed dye or pigment, an appropriate one can be selected from among those with desired tone. For example, an appropriate selection can be made from among titanium oxide, zinc oxide, etc. as a white tone pigment component, rouge (ferric oxide) as a red tone component, a chromium oxide containing pigment or dye as a green tone component and, further, blue, red, orange, yellow, green, purple, light brown and gray inorganic or organic pigments or dyes.

Therefore, a tone variation can be increased by not only selecting the type of pigment or dye to be contained in the resin substrate 12 but also, in the same manner as in Embodiment 1, selecting the type of metal of the metallic thin film layer 13 and effecting a varied combination of these.

Specifically, for example, the manufacturing of the timepiece indicating plate of this Embodiment was carried out as follows.

A white pigment of titanium oxide was mixed in a transparent resin of polycarbonate in an amount of 0.05% by weight based on the polycarbonate resin and pelletized. The obtained pellets were injection molded into resin substrate 12 of polycarbonate furnished with electroformed sandy pattern in the same manner as in Embodiment 1. The light transmission of this resin substrate 12 was 70%. Thereafter, the surface of the resin substrate was cleaned, and the same vacuum deposition as in Embodiment 1 was performed so that the front side surface of the resin substrate was furnished with a vacuum deposition coating of silver with 250 Å thickness (light transmission exhibited when the vacuum deposition was performed on the surface of a transparent resin substrate: 27.5%). Thus, the metallic thin film layer 13 was formed, thereby obtaining a timepiece indicating plate.

The obtained timepiece indicating plate was assembled in a solar timepiece. The tone was silver white which was whiter than the color peculiar to silver, and the sandy pattern was observed. The solar timepiece was full of an appearance of superior quality. The brown or dark-blue solar cell and the insulating band cross lines were not viewed through the indicating plate. The light transmission of the timepiece indicating plate was 20%, which was satisfactory for the energizing of the solar cell.

Embodiment 4

Figure 6:
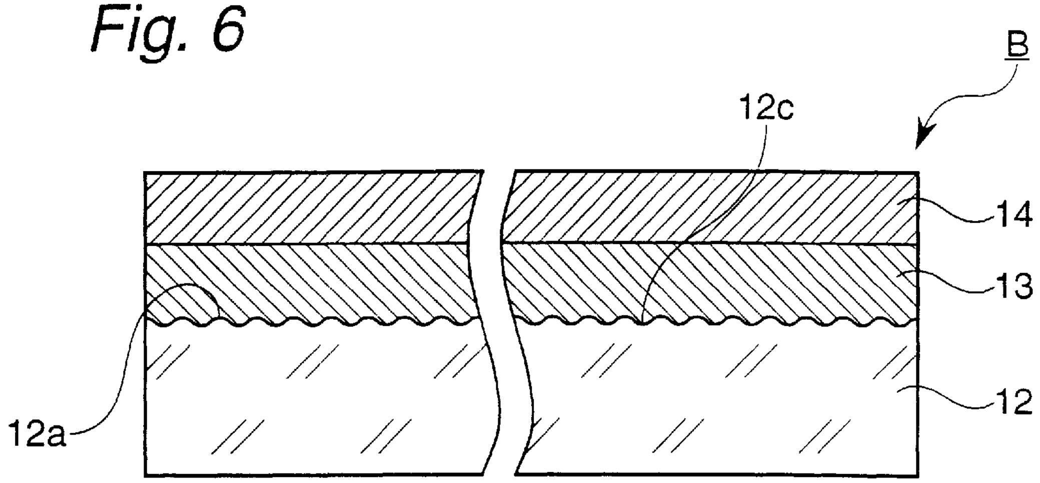
FIG. 6 is a sectional view of the timepiece indicating plate according to the fourth embodiment of the present invention.

FIG. 6 is a sectional view of the timepiece indicating plate according to the fourth embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that the upper surface of the metallic thin film layer 13 is provided with metallic thin film layer 14 of another metal to thereby constitute a multilayer laminate of metallic thin film layers. Thus, with respect to the same features as in Embodiment 1, the description thereof is omitted below.

For example, a film of gold, when it is as thin as 100 to 150 Å, does not exhibit the color peculiar to gold and is reddish-golden. However, this problem of incapability of exhibiting the color peculiar to gold with the use of a thin metallic thin film layer composed only of gold can be overcome. Namely, not only the timepiece indicating plate B can be endowed with the color peculiar to gold, but also the lowering of the light transmission thereof can be prevented by first forming the metallic thin film layer 13 of silver on the front side surface of the resin substrate 12 by, for example, the vacuum deposition and thereafter forming the metallic thin film layer 14 of gold on the upper surface of the metallic thin film layer 13 of silver by, for example, the vacuum deposition to thereby constitute a layer laminate. As a result, the silver white of the underlying metallic thin film layer 13 of silver is combined with the reddish golden color of the overlaid metallic thin film layer 14 of gold.

Although two metallic thin film layers 13, 14 are laminated to each other in this Embodiment, it is naturally feasible to form at least three metallic thin film layers into a multilayer laminate. Taking the light transmission into account, it is requisite that the total thickness of the metallic thin film layers be in the range of 100 to 500 Å.

The metallic thin film layers 13, 14, as in Embodiment 1, can be composed of one metal selected from the group consisting of Au, Ag, Al, Cu, Co, Cr, Fe, In, Ni, Pd, Pt, Rh, Sn and Ti or an alloy of at least two metals selected from the above group. For example, Au—Ag, Au—Cu, Au—Ni, Ag—Pd, Au—Al, Cu—Al, Au—Cr, Au—Co, Au—In or Pd—Ni can be used as a binary alloy, and Au—Cu—Pd, Au—Ag—Cu or Au—In—Co can be used as a ternary alloy. Therefore, timepiece indicating plates with various metallic colors which have not been realized by the use of a single metallic thin film layer can be manufactured by forming each of various combinations of these metals into a multilayer laminate, so that a design variation can extensively be increased.

In this Embodiment, as in Embodiment 3, it is naturally feasible to color the resin substrate 12 by the addition of a colorant such as a pigment or dye thereto, thereby increasing a tone variation.

Specifically, for example, the manufacturing of the timepiece indicating plate of this Embodiment was carried out as follows.

Resin substrate 12 of polycarbonate furnished with electroformed sandy pattern was produced in the same manner as in Embodiment 1. The surface of the resin substrate was cleaned, and the same vacuum deposition as in Embodiment 1 was performed so that the front side surface of the resin substrate was furnished with a vacuum deposition coating of silver with 115 Å thickness (light transmission: 50%), thereby providing the metallic thin film layer 13. Thereafter, the upper surface of the metallic thin film layer 13 was furnished with a coating of gold with 90 Å thickness (light transmission: 60%) by the vacuum deposition, thereby providing the metallic thin film layer 14. Thus, a timepiece indicating plate was obtained.

The obtained timepiece indicating plate was assembled in a solar timepiece. The color peculiar to gold was exhibited, and the sandy pattern was observed. The solar timepiece was full of an appearance of superior quality. The brown or dark-blue solar cell and the insulating band cross lines were not viewed through the indicating plate. The light transmission of the timepiece indicating plate was 30%, which was satisfactory for the energizing of the solar cell.

Embodiment 5

Figure 7:
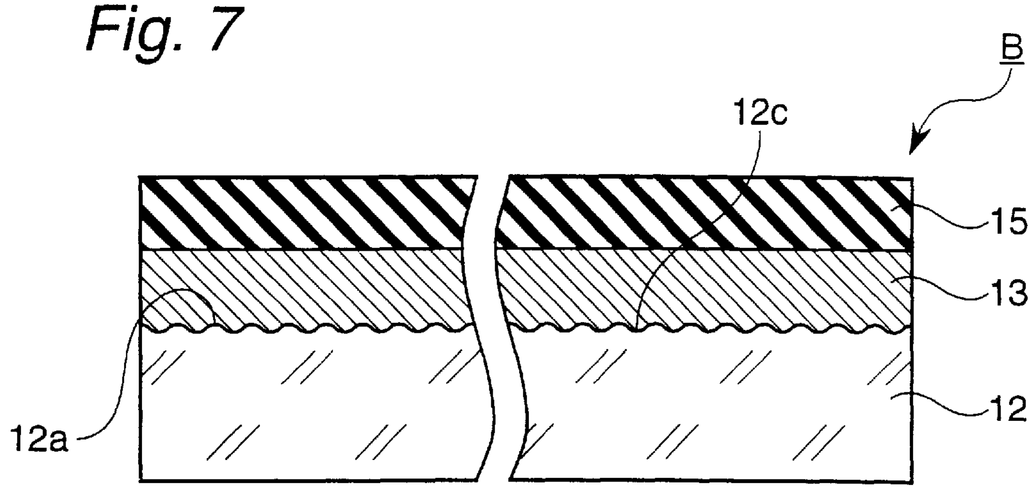
FIG. 7 is a sectional view of the timepiece indicating plate according to the fifth embodiment of the present invention.

FIG. 7 is a sectional view of the timepiece indicating plate according to the fifth embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that, further, the upper surface of the metallic thin film layer 13 is furnished with coating film layer 15 which also functions as a surface protective layer. Thus, with respect to the same features as in Embodiment 1, the description thereof is omitted below.

In this construction, the coating film layer 15 can be provided by applying a translucent resin (colored ink) such as an acrylic resin, a urethane resin, an alkyd resin or an epoxy resin to the surface of the metallic thin film layer 13 by screen printing or pad printing or by coating the surface of the metallic thin film layer 13 with a colored paint. Further, a gradation (shading) coating can be conducted by blowing the colored paint onto the surface of the metallic thin film layer 13 with the use of, for example, a spray. This coating film layer 15 can be provided on the entirety or a part of the surface of the metallic thin film layer 13. This coating film layer 15 is also effective in preventing the deterioration of the metallic thin film layer 13 due to, for example, oxidation. According to necessity, polishing such as lapping polishing or buff polishing can be performed to thereby render the surface of the surface protective layer smooth and glossy so that the appearance quality of the indicating plate is enhanced.

In particular, when the metallic thin film layer provided on the resin substrate is composed of Ag or Cu. the metallic thin film layer suffers from discoloration, rust, etc. unless a surface protective layer is present on the surface of the metallic thin film layer. Therefore, the formation of the surface protective layer is preferred.

In this construction, the metallic color of the metallic thin film layer 13 is combined with the color of the coating film layer 15 to thereby enable diversifying the design of the timepiece indicating plate.

Naturally, the surface protection can be effected by the use of a transparent resin (transparent ink) such as an acrylic resin, a urethane resin, an alkyd resin or an epoxy resin.

In this Embodiment, as in Embodiment 3, it is naturally feasible to color the resin substrate 12 by the addition of a colorant such as a pigment or dye thereto, thereby increasing a tone variation.

Specifically, for example, the manufacturing of the timepiece indicating plate of this Embodiment was carried out as follows.

Resin substrate of polycarbonate furnished with electroformed sandy pattern was produced in the same manner as in Embodiment 1. The surface of the resin substrate was cleaned, and the same vacuum deposition as in Embodiment 1 was performed so that the front side surface of the resin substrate was furnished with a vacuum deposition coating of gold with 400 Å thickness (light transmission: 16%), thereby providing the metallic thin film layer 13. Thereafter, the upper surface of the metallic thin film layer 13 was coated with a blue paint so that the coating thickness was about 10 $\mu$m, thereby obtaining a timepiece indicating plate (light transmission exhibited when the coating was performed on the surface of a transparent resin substrate: 63%).

The obtained timepiece indicating plate was assembled in a solar timepiece. The slightly-greenish golden color rather than the color peculiar to gold was exhibited, and the sandy pattern was observed. The solar timepiece was full of an appearance of superior quality. The brown or dark-blue solar cell and the insulating band cross lines were not viewed through the indicating plate. The light transmission of the timepiece indicating plate was 10%, which was satisfactory for the energizing of the solar cell.

Embodiment 6

Figure 8:
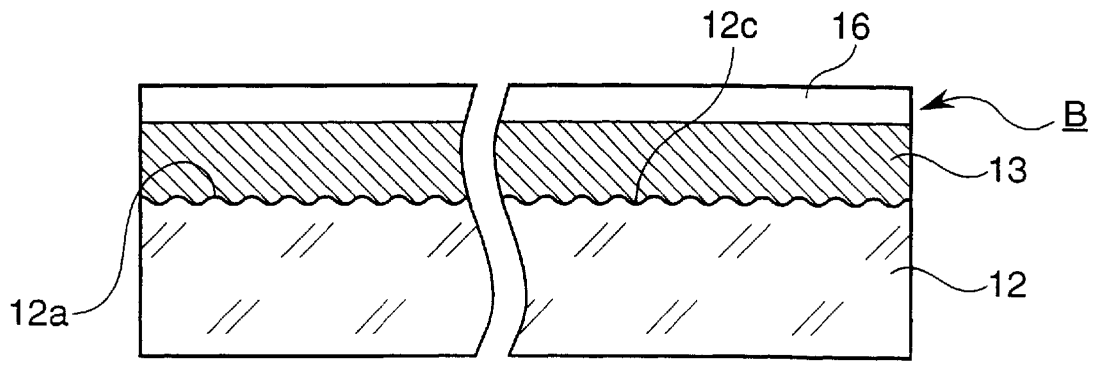
FIG. 8 is a sectional view of the timepiece indicating plate according to the sixth embodiment of the present invention.

FIG. 8 is a sectional view of the timepiece indicating plate according to the sixth embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that, further, the upper surface of the metallic thin film layer 13 is furnished with film layer 16 which also functions as a surface protective layer. Thus, with respect to the same features as in Embodiment 1, the description thereof is omitted below.

In this construction, the film layer 16 is not particularly limited, and, for example, a polyethylene film or a polyester film can be used therein. It is preferred that the film thickness be in the range of 10 to 200 $\mu$m, especially, 30 to 60 $\mu$m, from the viewpoint of the surface protective capability for the metallic thin film layer 13. The formation of this film layer 16 on the upper surface of the metallic thin film layer 13 can be accomplished by attaching the film layer 16 to the upper surface of the metallic thin film layer 13 by means of an adhesive such as that of an acrylic resin, or by melt extruding a resin such as polyethylene or polyester onto the upper surface of the metallic thin film layer 13 to thereby execute a lamination. Moreover, the film per se can be loaded with the above pigment or dye, thereby increasing the variation of tone of the timepiece indicating plate.

This film layer 16 functions as a surface protective layer. In particular, when the metallic thin film layer provided on the resin substrate is composed of Ag or Cu, the metallic thin film layer suffers from discoloration, rust, etc. unless a surface protective layer is present on the surface of the metallic thin film layer. Therefore, the formation of the surface protective layer consisting of this film layer 16 is preferred.

This film layer 16 can be provided on the entirety or a part of the surface of the metallic thin film layer 13.

In this construction, the film layer 16 enables preventing the deterioration of the metallic thin film layer 13 due to, for example, oxidation. When the film layer 16 per se is loaded with a pigment or dye, the metallic color of the metallic thin film layer 13 is combined with the color of the paint or pigment of the film layer 16 to thereby enable diversifying the design of the timepiece indicating plate.

In this Embodiment, as in Embodiment 2, it is naturally feasible to color the resin substrate 12 by the addition of a colorant such as a pigment or dye thereto, thereby increasing a tone variation.

Specifically, for example, the manufacturing of the timepiece indicating plate of this Embodiment was carried out as follows.

Resin substrate of polycarbonate furnished with electroformed sandy pattern was produced in the same manner as in Embodiment 1. The surface of the resin substrate was cleaned, and the same vacuum deposition as in Embodiment 1 was performed so that the front side surface of the resin substrate was furnished with a vacuum deposition coating of gold with 200 Å thickness (light transmission: 37.5%), thereby providing the metallic thin film layer 13. Thereafter, a polyethylene resin containing a white pigment of titanium oxide in an amount of 0.002% by weight based on the weight of the polyethylene resin was melt extruded onto the upper surface of the metallic thin film layer 13 to thereby effect a lamination such that the film thickness was 50 $\mu$m (light transmission: 60%). Thus, there was obtained a timepiece indicating plate. The obtained timepiece indicating plate was assembled in a solar timepiece. The slightly-milky-golden color rather than the color peculiar to gold was exhibited, and the sandy pattern was observed. The solar timepiece was full of an appearance of superior quality. The brown or dark-blue solar cell and the insulating band cross lines were not viewed through the indicating plate. The light transmission of the timepiece indicating plate was 22.5%, which was satisfactory for the energizing of the solar cell.

Embodiment 7

Figure 9:
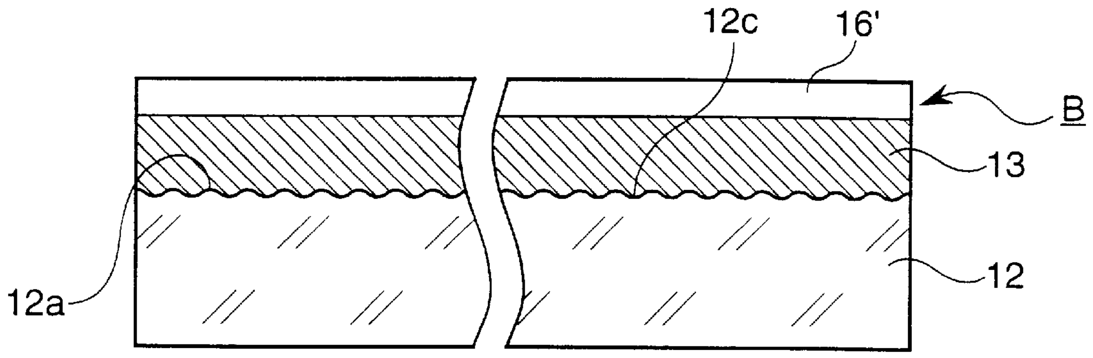
FIG. 9 is a sectional view of the timepiece indicating plate according to the seventh embodiment of the present invention.

FIG. 9 is a sectional view of the timepiece indicating plate according to the seventh embodiment of the present invention.

The timepiece indicating plate B of this Embodiment is basically the same as that of Embodiment 1, for example, in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that, further, the upper surface of the metallic thin film layer 13 is furnished with metal oxide coating film layer 16' which also functions as a surface protective layer. Thus, with respect to the same features as in Embodiment 1, the description thereof is omitted below.

In particular, when the metallic thin film layer 13 provided on the resin substrate 12 is composed of Ag or Cu, the metallic thin film layer 13 suffers from discoloration, rust, etc. unless a surface protective layer is present on the surface of the metallic thin film layer. Therefore, the formation of this surface protective layer is required.

For the above purpose, the surface protective layer may be composed of a metal oxide coating film. This metal oxide coating film is preferably formed by, for example, the vacuum deposition of a metal oxide such as MgO, $TiO_2$, $SiO_2$, SiO, $ZrO_2$ or $Al_2O_3$.

In the vacuum deposition, it is preferred that the pressure inside the chamber of the vacuum deposition apparatus be in the range of $1\times10^{-6}$ to $5\times10^{-5}$ torr ($1.33\times10^{-4}$ *to* $6.65\times10^{-3}$ Pa). It is preferred that the thickness of the metal oxide coating film be in the range of 500 to 10,000 Å, especially, 1000 to 5000 Å, from the viewpoint of the light transmission, protecting capability as a protective film, and mechanical strength, etc. Namely, when the thickness is smaller than 500 Å, the protecting capability as a protective film is not satisfactory. On the other hand, when the thickness is greater than 10,000 Å, the coating film becomes brittle and the mechanical strength is poor.

The formation of the metal oxide coating film 16' on the surface of the resin substrate 12 can be accomplished by the use of not only the above vacuum deposition technique but also other dry plating techniques such as the ion plating or the sputtering technique.

Specifically, for example, the manufacturing of the timepiece indicating plate of this Embodiment was carried out as follows.

In the same manner as in Embodiment 1, an injection molding metal mold having an electroformed sandy pattern provided on its inner surface was fabricated by the electroforming method. Injection molding of a polycarbonate was performed with the use of this injection molding metal mold to thereby prepare a resin substrate having a surface to which the electroformed sandy pattern was transferred. The surface of this resin substrate was cleaned (cleaning by surface degreasing, cleaning using a neutral detergent or, according to necessity, cleaning by ion bombardment (ion bombarding method)). The resultant resin substrate was heated under a pressure of $5\times10^{-6}$ torr in the chamber of a vacuum deposition apparatus, and the vacuum deposition of silver was performed so that the resin substrate was furnished with a vacuum deposition coating of silver with 250 Å thickness (light transmission exhibited when the vacuum deposition was performed on the surface of a transparent resin substrate: 27.5%). Thus, the metallic thin film layer 13 was formed.

Thereafter, the vacuum deposition of $SiO_2$ was performed under the same conditions in the same vacuum deposition apparatus so that the upper surface of the metallic thin film layer 13 was furnished with a vacuum deposition coating of $SiO_2$ with 1500 Å thickness, thereby providing the metallic thin film layer 16'. Thus, a timepiece indicating plate was obtained.

The obtained timepiece indicating plate was assembled in a solar timepiece. The tone was silver white which was whiter than the color peculiar to silver, and the sandy pattern was observed. The solar timepiece was full of an appearance of superior quality. The brown or dark-blue solar cell and the insulating band cross lines were not viewed through the indicating plate. The light transmission of the timepiece indicating plate was 30%, which was satisfactory for the energizing of the solar cell.

Embodiment 8

Figure 10:
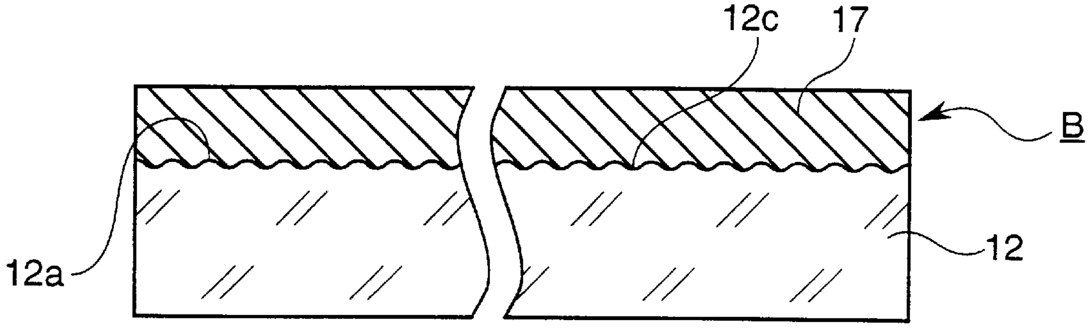
FIG. 10 is a sectional view of the timepiece indicating plate according to the eighth embodiment of the present invention.

FIG. 10 is a sectional view of the timepiece indicating plate according to the eighth embodiment of the present invention.

The timepiece indicating plate B of this Embodiment is basically the same as that of Embodiment 1, for example, in that the metallic thin film layer 17 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that the metallic thin film layer 17 consists of a black-tone thin film of a metal nitride. Thus, with respect to the same features as in Embodiment 1, the description thereof is omitted below.

The metal nitride which constitutes the metallic thin film layer 17 can be prepared from Au, Ag, Al, Cu, Co, Cr, Fe, Ni, Pd, Rh, Ti or a Ti alloy. The formation of the metallic thin film layer 17 on the surface of the resin substrate 12 can be accomplished by the use of the ion plating technique which is one of the dry plating techniques. With respect to the conditions of the ion plating, the ion plating can be performed by evacuating the chamber to a vacuum of $5\times10^{-5}$ to $5\times10^{-1}$ torr, applying a voltage of hundreds to thousands of volts and introducing a mixture of nitrogen gas and Ar gas which contains oxygen and carbon dioxide.

In this construction, the black tone of the metallic thin film layer 17 enables realizing an appearance of superior quality as that of a precious stone and enables diversifying the design of the timepiece indicating plate.

In this Embodiment, as in Embodiment 2, it is naturally feasible to color the resin substrate 12 by the addition of a colorant such as a pigment or dye thereto, thereby increasing a tone variation.

Specifically, for example, the manufacturing of the timepiece indicating plate of this Embodiment was carried out as follows.

Resin substrate of polycarbonate furnished with electroformed radial pattern was produced in the same manner as in Embodiment 1. The surface of the resin substrate was cleaned, and the cleaned resin substrate was secured to a base holder. A mixed gas of nitrogen and argon which contains 3% by volume of oxygen and 2% by volume of carbon dioxide was introduced in the chamber, and the pressure inside the chamber was maintained at $5\times10^{-3}$ torr by regulating the quantities of exhausted gas and fed gas.

Metallic titanium was bombarded by electron beams of 10 kV accelerating voltage and 0.3 A current so that the titanium was heated to 1600° C. and gasified. Thereafter, ionic current of 50 V d.c. voltage and 10 A was passed between metallic titanium vapor source as a positive electrode and base as a negative electrode for 5 min so that a thin film of titanium nitride having a thickness of about 450 Å was formed on the resin substrate.

The thus obtained timepiece indicating plate was assembled in a solar timepiece. Black tone and gloss like that of a precious stone was exhibited, and the radial pattern was observed. The solar timepiece was full of an appearance of superior quality. The brown or dark-blue solar cell and the insulating band cross lines were not viewed through the indicating plate. The light transmission of the timepiece indicating plate was 10%, which was satisfactory for the energizing of the solar cell.

Embodiment 9

Figure 11:
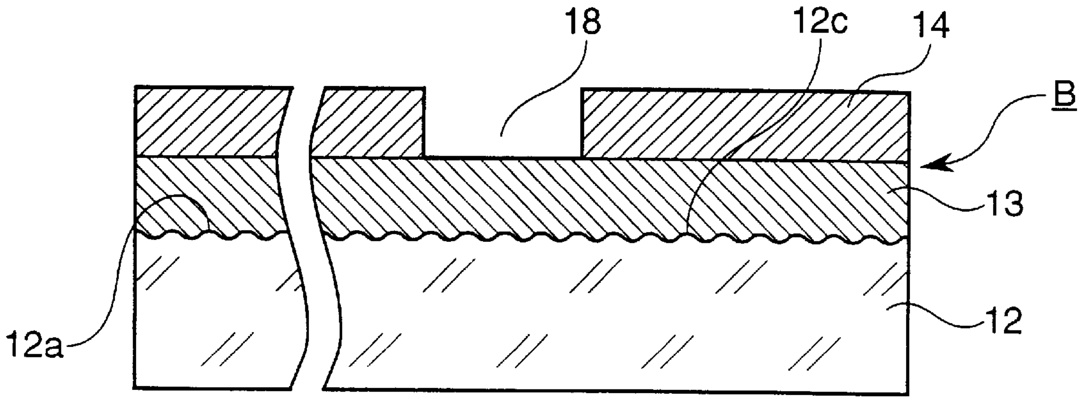
FIG. 11 is a sectional view of the timepiece indicating plate according to the ninth embodiment of the present invention.

FIG. 11 is a sectional view of the timepiece indicating plate according to the ninth embodiment of the present invention.

The timepiece indicating plate B of this Embodiment is basically the same as that of Embodiment 4, for example, in that the metallic thin film layer 13 is formed on the surface of the front side (light incident side) 12*a* of the resin substrate 12, in that the upper surface of the metallic thin film layer 13 is furnished with the metallic thin film layer 14 of other metal and in that the surface of the front side (light incident side) 12*a* of the resin substrate 12 is furnished with minute irregularity pattern 12*c*. However, the timepiece indicating plate B of this Embodiment is different from that of Embodiment 4 in that, further, the metallic thin film layer 14 is provided with a partially cut off portion 18. Thus, with respect to the same features as in Embodiment 4, the description thereof is omitted below.

For example, a film of gold, when it is as thin as 100 to 150 Å, does not exhibit the color peculiar to gold and is reddish-golden. However, this problem of incapability of exhibiting the color peculiar to gold with the use of a thin metallic thin film layer composed only of gold can be overcome. Namely not only the timepiece indicating plate B can be endowed with the color peculiar to gold, but also the lowering of the light transmission thereof can be prevented by first forming metallic thin film layer 13 of silver on the front side surface of the resin substrate 12 by, for example, the vacuum deposition and thereafter forming metallic thin film layer 14 of gold on the upper surface of the metallic thin film layer 13 of silver by, for example, the vacuum deposition to thereby constitute a layer laminate. As a result, the silver white of the underlying metallic thin film layer 13 of silver is combined with the reddish golden color of the overlaid metallic thin film layer 14 of gold.

At the cut off portion 18 of the metallic thin film layer 14, the pattern is such that the light silver white of the underlying metallic thin film layer 13 of silver appears, so that a design variation can be increased.

Figure 12:
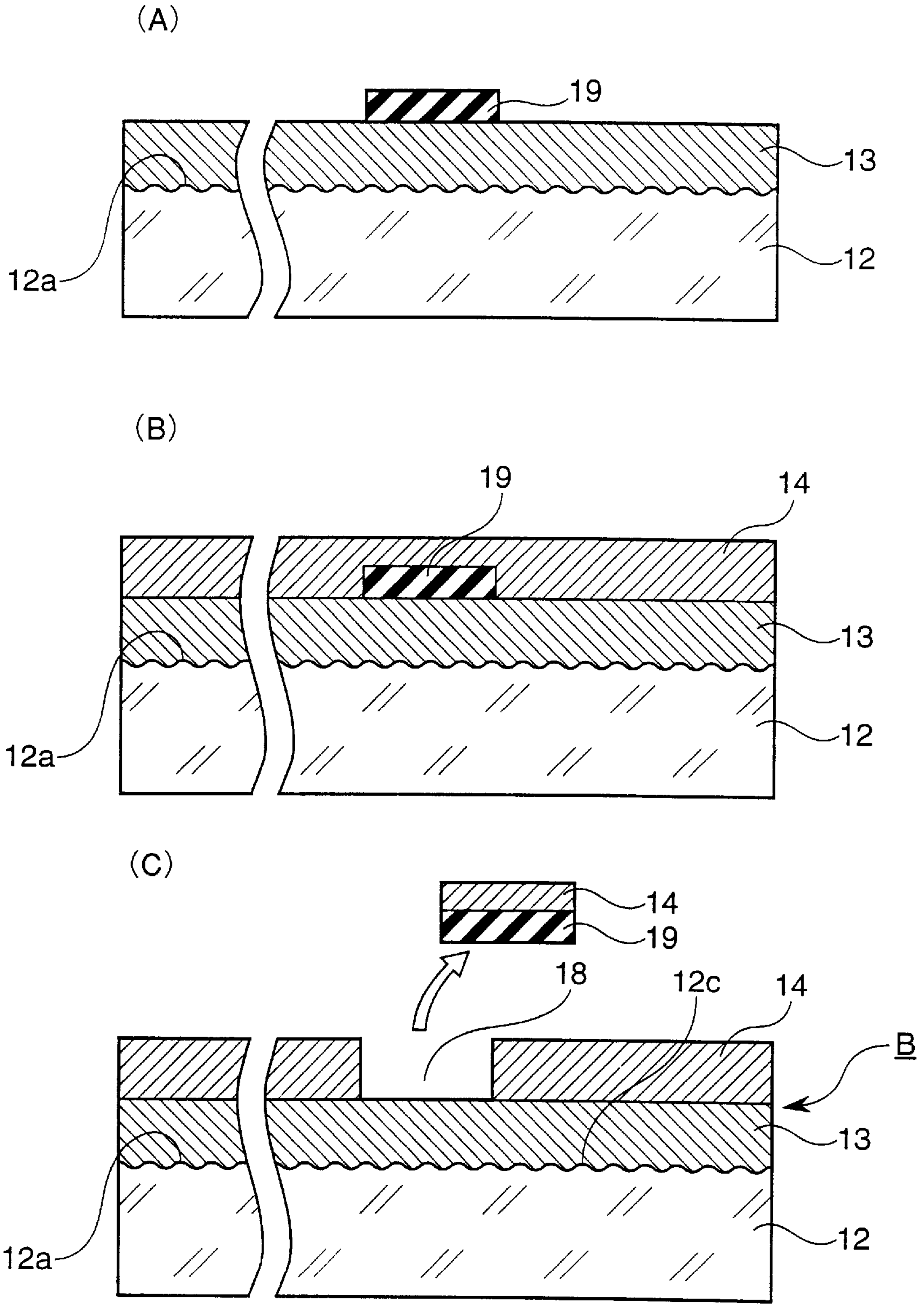
FIGS. 12(A) to (C) are sectional views explaining a method of furnishing the metallic thin film layer coating with a cut off portion.

The metallic thin film layer 14 can be furnished with the cut off portion by the following method. Referring to FIG. 12(A), first, the metallic thin film layer 13 is formed on the surface of the front side 12*a* of the resin substrate 12 by the dry plating such as vacuum deposition. Subsequently, masking 19 as a lift-off material is applied to the upper surface of the metallic thin film layer 13 at part corresponding to the cut off portion 18 by the use of photoresist or masking ink. Referring now to FIG. 12(B), the metallic thin film layer 14 is formed on the entire surface thereof by, for example, the vacuum deposition. Thereafter, referring to FIG. 12(C), the part of metallic thin film layer 14 corresponding to the cut off portion 18 is removed (lifted off) together with the masking 19 by, for example, the dissolution of the masking 19, thereby obtaining the timepiece indicating plate with the structure of FIG. 11.

Figure 13:
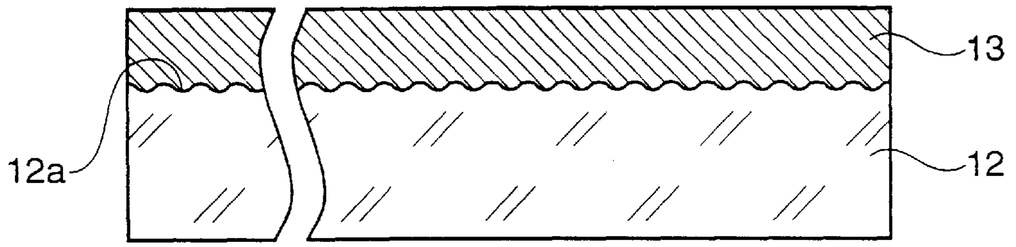
FIGS. 13(A) to (C) are sectional views explaining another method of furnishing the metallic thin film layer coating with a cut off portion.
Figure 13:
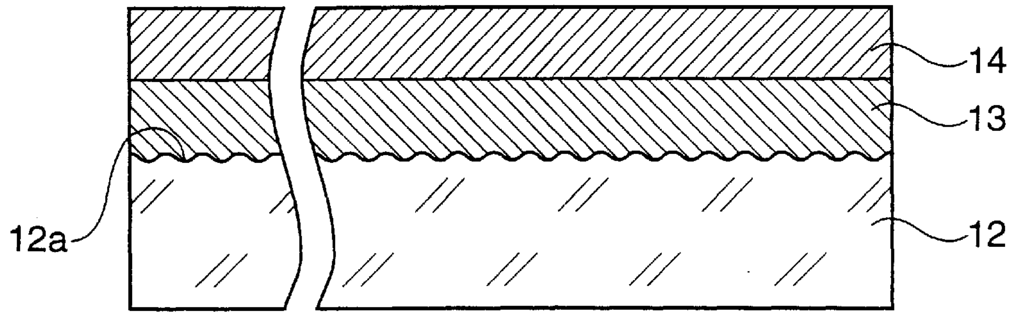
Figure 13:
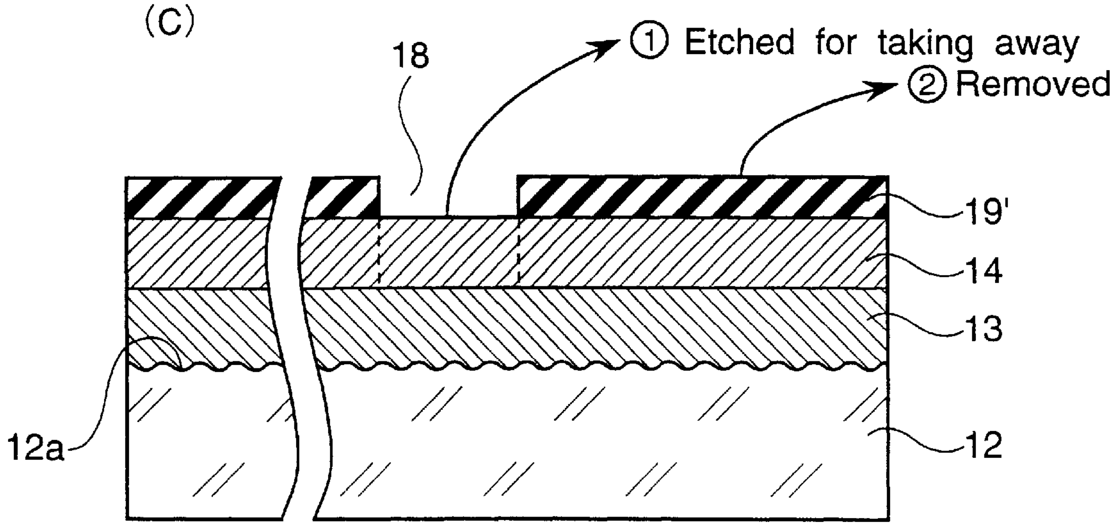

Alternatively, the metallic thin film layer 14 can be funished with the cut off portion by the following method. Referring to FIG. 13(A), first, the metallic thin film layer 13 is formed on the surface of the front side 12*a* of the resin substrate 12 by dry plating such as vacuum deposition. Subsequently, referring to FIG. 13(B), the metallic thin film layer 14 is formed on the entire surface thereof by, for example; vacuum deposition. Thereafler, referring to FIG. 13 (C), masking 19' is applied to the upper surface of the metallic thin film layer 14 at a part other than that corresponding to the cut off portion 18 by the use of photoresist. The part of the metallic thin film layer 14 corresponding to the cut off portion 18 is etched away, and the masking 19' disposed at a part other than that corresponding to the cut off portion 18 is removed to thereby obtain the timepiece indicating plate with the structure of FIG. 11.

Although two metallic thin film layers 13, 14 are laminated to each other in this Embodiment, it is naturally feasible to form at least three metallic thin film layers into a multilayer laminate. Taking the light transmission into account, it is requisite that the total thickness of the metallic thin film layers be in the range of 100 to 500 Å.

Therefore, timepiece indicating plates with various metallic colors which have not been realized by the use of a single metallic thin film layer can be manufactured by forming each of various combinations of these metals into a multilayer laminate. Moreover, the cut off portion of the metallic thin film layer enables creating patterns formulated by different metallic tones of the topmost metallic thin film layer, the middle metallic thin film layer and the underlying metallic thin film layer, so that a design variation can extensively be increased.

In this Embodiment, as in Embodiment 3, it is naturally feasible to color the resin substrate 12 by the addition of a colorant such as a pigment or dye thereto, thereby increasing a tone variation.

Specifically, for example, the manufacturing of the timepiece indicating plate of this Embodiment was carried out as follows.

Resin substrate 12 of polycarbonate furnished with electroformed sandy pattern was produced in the same manner as in Embodiment 1. The surface of the resin substrate was cleaned, and the vacuum deposition of chromium was performed in the same manner as in Embodiment 1 so that the front side surface of the resin substrate was furnished with a vacuum deposition coating of chromium with 150 Å thickness (light transmission: 40%). Thus, the metallic thin film layer 13 was formed. Thereafter, masking 19 as a lift-off material was applied to the upper surface of the metallic thin film layer 13 at a part corresponding to the cut off portion 18 by the use of a photoresist soluble in, for example, a solvent. Then, the vacuum deposition of gold was performed so that the entire surface was furnished with a vacuum deposition coating of gold with 150 Å thickness (light transmission exhibited when the vacuum deposition was performed on the surface of a transparent resin substrate: 47%), thereby providing the metallic thin film layer 14. The part of metallic thin film layer 14 corresponding to the cut off portion 18 was removed together with the masking 19 by dissolving away the solvent-soluble resist as the masking material with the use of an exclusive-use organic solvent such as xylene, toluene or acetone. Thus, a timepiece indicating plate was obtained.

The thus obtained timepiece indicating plate was assembled in a solar timepiece. Pattern of the metallic gray of the underlying metallic thin film layer 13 composed of chromium was observed at the cut off portion 18 of the metallic thin film layer 14, and the color peculiar to gold was exhibited at the other part. By virtue of delicate tone and sandy pattern, characteristic design was realized to render the solar timepiece full of an appearance of superior quality. The brown or dark-blue solar cell and the insulating band cross lines were not viewed through the indicating plate. The light transmission of the timepiece indicating plate was 23% (light transmission for the entirety inclusive of the cut off portion) (area of the single layer of chromium: 20%), which was satisfactory for the energizing of the solar cell.

Furthermore, resin substrate 12 of polycarbonate furnished with electroformed radial pattern was produced in the same manner as in Embodiment 1. The surface of the resin substrate was cleaned, and the vacuum deposition of aluminum was performed in the same manner as in Embodiment 1 so that the front side surface of the resin substrate was furnished with a vacuum deposition coating of aluminum with 100 Å thickness (light transmission: 50%). Thus, the metallic thin film layer 13 was formed. Thereafter, the vacuum deposition of copper was performed so that the entire surface was furnished with a vacuum deposition coating of copper with 130 Å thickness (light transmission exhibited when the vacuum deposition was performed on the surface of a transparent resin substrate: 50%), thereby providing the metallic thin film layer 14. Then, masking 19' was applied to the upper surface of the metallic thin film layer 14 at a part other than that corresponding to the cut off portion 18 by the use of a photoresist based on PVA (polyvinyl alcohol)/ammonium bichromate. The part of metallic thin film layer 14 corresponding to the cut off portion 18 was etched away with the use of an aqueous ferric chloride solution of 40° Baume (heated to 40–60° C.). The masking 19' was removed with the use of an organic solvent such as acetone. Thereafter, likewise, the vacuum deposition of gold was performed so that the upper surface of the metallic thin film layer 14 was furnished with a vacuum deposition coating of gold with 150 Å thickness (light transmission: 47%) to thereby provide a further metallic thin film layer, in the manner such that partial cut off portion was provided on the upper surface of the metallic thin film layer 14 by masking (masking conducted also on the cut off portion 18 where aluminum was visible). Thus, a timepiece indicating plate was obtained.

The thus obtained timepiece indicating plate was assembled in a solar timepiece. The golden tone peculiar to gold was exhibited where the topmost metallic thin film layer of gold, the middle metallic thin film layer 14 of copper and the lowest metallic thin film layer 13 of aluminum were piled one upon another. Purplish pink was exhibited where the topmost metallic thin film layer of gold was cut off. Pattern of the metallic silver color of the underlying aluminum was observed where the middle metallic thin film layer 14 and the topmost metallic thin film layer of gold were cut off. By virtue of delicate tone and radial pattern, characteristic design was realized to render the solar timepiece full of an appearance of superior quality. The brown or dark-blue solar cell and the insulating band cross lines were not viewed through the indicating plate. The light transmission of the timepiece indicating plate was 17.5% (light transmission for the entirety inclusive of the cut off portion) (area of the triple layer portion: 80%, area of the double layer portion: 10%, and area of the single layer portion: 10%), which was satisfactory for the energizing of the solar cell.

Embodiment 10

Figure 14:
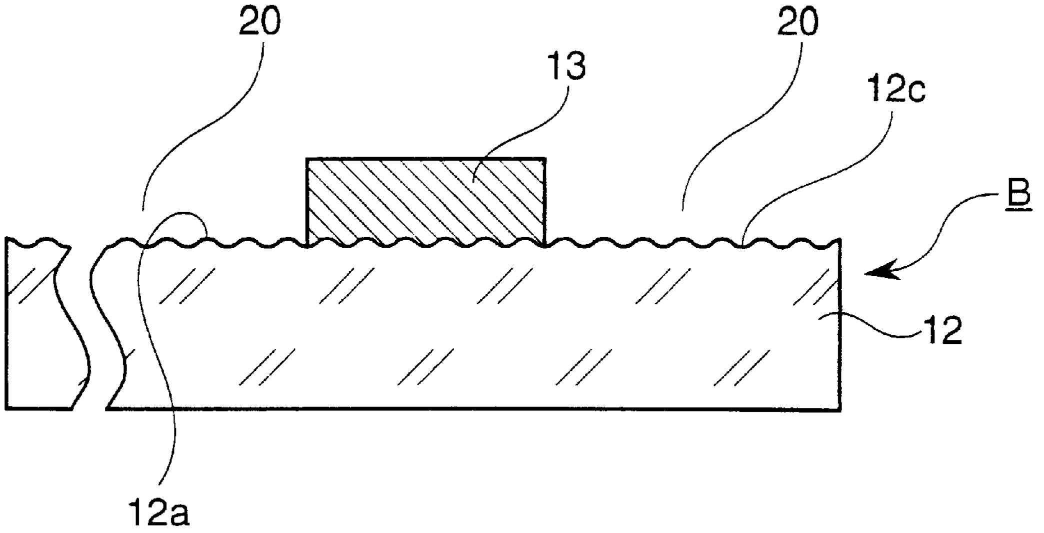
FIG. 14 is a sectional view of the timepiece indicating plate according to the tenth embodiment of the present invention.

FIG. 14 is a sectional view of the timepiece indicating plate according to the tenth embodiment of the present invention.

The timepiece indicating plate B of this Embodiment is basically the same as that of Embodiment 3, for example, in that the metallic thin film layer 13 is formed on the surface of the front side (light incident side) 12*a* of the resin substrate 12, in that the surface of the front side (light incident side) 12*a* of the resin substrate 12 is furnished with minute irregularity pattern 12*c* and in that the resin substrate 12 is colored by the addition of a colorant such as a pigment or dye thereto. However, the timepiece indicating plate B of this Embodiment is different from that of Embodiment 3 in that the metallic thin film layer 13 is furnished with partially cut off portion 20. Thus, with respect to the same features as in Embodiment 3, the description thereof is omitted below.

The furnishing of the metallic thin film layer 13 with the cut off portion 20 can be accomplished by masking with the use of photoresist or masking ink as in Embodiment 7.

In this construction, not only can a pattern that partially makes the best use of various tones or transparency of the resin substrate 12 be created at the cut off portion 20 of the metallic thin film layer 13 but also, at the noncut off portion, a metallic tone variation can be increased by selecting the type of pigment or dye to be contained in the resin substrate 12, selecting the type of metal of the metallic thin film layer 13 as in Embodiment 1 and effecting various combinations thereof.

Specifically, for example, the manufacturing of the timepiece indicating plate of this Embodiment was carried out as follows.

A white pigment of titanium oxide was mixed in a transparent resin of polycarbonate in an amount of 0.05% by weight based on the polycarbonate resin and pelletized. The obtained pellets were injection molded into resin substrate 12 of polycarbonate furnished with an electroformed sandy pattern in the same manner as in Embodiment 1. The light transmission of this resin substrate 12 was 70%. Thereafter, the surface of the resin substrate was cleaned, and the same vacuum deposition as in Embodiment 1 was performed so that the front side surface of the resin substrate was furnished with a vacuum deposition coating of gold with 200 Å thickness (light transmission exhibited when the vacuum deposition was performed on the surface of a transparent resin substrate: 37.5%). Thus, the metallic thin film layer 13 was formed. Then, making was applied to the upper surface of the metallic thin film layer 13 at a part other than that corresponding to the cut off portion 20 by printing a masking ink composed of an epoxy resin. The part of metallic thin film layer 13 corresponding to the cut off portion was etched away with the use of an aqua regia. The masking was removed with the use of a peeling agent comprising MEK (methyl ethyl ketone) and, added thereto, a strong acid such as formic acid. Thus, a timepiece indicating plate was obtained.

The obtained timepiece indicating plate was assembled in a solar timepiece. The color peculiar to gold was exhibited at the portion of the metallic thin film layer 13. The cut off portion 20 (area of cut off portion: 10%) of the metallic thin film layer 13 was white and imparted transparency feeling. The sandy pattern was observed on the entirety, and the solar timepiece was full of an appearance of superior quality. The brown or dark-blue solar cell and the insulating band cross lines were not viewed through the indicating plate. The light transmission of the timepiece indicating plate was 30%, which was satisfactory for the energizing of the solar cell.

Embodiment 11

Figure 15:
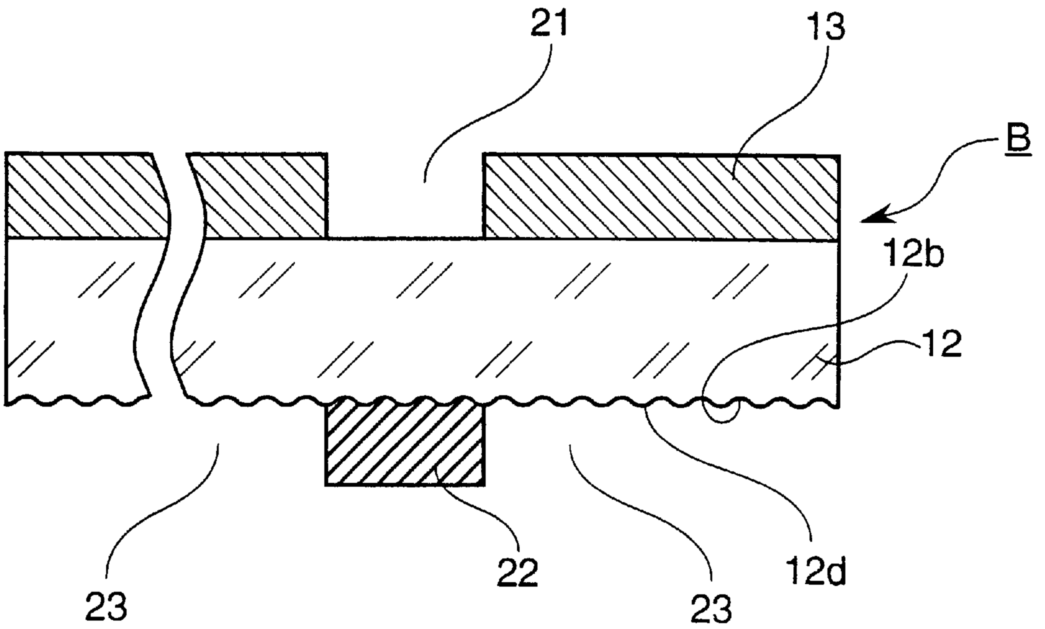
FIG. 15 is a sectional view of the timepiece indicating plate according to the eleventh embodiment of the present invention.

FIG. 15 is a sectional view of the timepiece indicating plate according to the eleventh embodiment of the present invention.

In the timepiece indicating plate B of this Embodiment, the surface of the front side (light incident side) 12*a* of the resin substrate 12 is provided with metallic thin film layer 13 having partially cut off portion 21. In addition, the back 12*b* (solar cell side) of the resin substrate 12 is furnished with metallic thin film layer 22 at the position corresponding to the cut off portion. This metallic thin film layer 22 has a cut off portion 23 corresponding to the upper metallic thin film layer 13. In this Embodiment, as different from the above Embodiments 1 to 8, the surface of the front side (light incident side) 12*a* of the resin substrate 12 is not furnished with minute irregularity pattern 12*c*, and the surface of the back 12*b* (solar cell side) of the resin substrate 12 is furnished with minute irregularity pattern 12*d*. The particulars of the metallic thin film layers 13 and 22, the resin substrate 12 and the pattern 12*d* are the same as in Embodiment 1, so that the description thereof is omitted below.

The furnishing of the metallic thin film layer 13 with the cut off portion 21 and the furnishing of the metallic thin film layer 22 with the cut off portion 23 can be accomplished by masking in which printing is conducted with the use of photoresist or masking ink, as in Embodiment 7.

In this construction, at the cut off portion 21 of the metallic thin film layer 13, the transparency of the resin substrate 12 is partially imparted to the metallic color of the underlying metallic thin film layer 22 so that the pattern 12*d* realizes a three-dimensionally deep expression. On the other hand, at the portion of the metallic thin film layer 13, its metallic color is deepened by the pattern 12*d*, thereby increasing a design variation.

In this Embodiment, as in Embodiment 3, it is naturally feasible to color the resin substrate 12 by the addition of a colorant such as a pigment or dye thereto, thereby increasing a tone variation. Specifically, for example, the manufacturing of the timepiece indicating plate of this Embodiment was carried out as follows.

In the same manner as in Embodiment 1, a polycarbonate resin was injection molded into resin substrate 12 of polycarbonate furnished with electroformed sandy pattern. Subsequently, the surface of this resin substrate was cleaned, and the surface of resin substrate not furnished with the pattern 12*d*, used as a front side, was subjected to vacuum deposition of gold in which masking was conducted as in Embodiment 8 so that the surface was furnished with a gold coating of 295 Å thickness (light transmission: 25%). Thus, there was provided the metallic thin film layer 13 having cut off portion 21. Thereafter, the surface of the pattern side 12*d* of the resin substrate 12, used as a back side (solar cell side), was subjected to vacuum deposition of silver in which masking was likewise conducted so that the surface was furnished with a silver coating of 265 Å thickness (light transmission: 25%). Thus, there was provided the metallic thin film layer 22 having cut off portion 23 corresponding to the upper metallic thin film layer 13, thereby obtaining a timepiece indicating plate.

The obtained timepiece indicating plate was assembled in a solar timepiece. At the portion of the metallic thin film layer 13, the color peculiar to gold was exhibited and the metallic color was deepened by the sandy pattern. On the other hand, at the cut off portion 21 of the metallic thin film layer 13, the transparency of the resin substrate 12 was partially imparted to the silver white color of the underlying metallic thin film layer 22 so that the pattern 12*d* exhibited a three-dimensionally deep expression and so that characteristic design was realized to render the solar timepiece full of an appearance of superior quality. The brown or dark-blue solar cell and the insulating band cross lines were not viewed through the indicating plate. The light transmission of the timepiece indicating plate was about 25%, which was satisfactory for the energizing of the solar cell.

In all the above Embodiments 9 to 11, the formation of the cut off portion was performed by either the method in which masking was followed by chemical etching or the method in which, after masking, a metallic thin film was formed on the surface and, thereafter, the overlaid metallic thin film was removed (lifted off) simultaneously with the dissolution-away of the mask with an organic solvent. Needless to mention, both the methods are effective in the formation of the cut off portion in this Embodiment.

Embodiment 12

Figure 16:
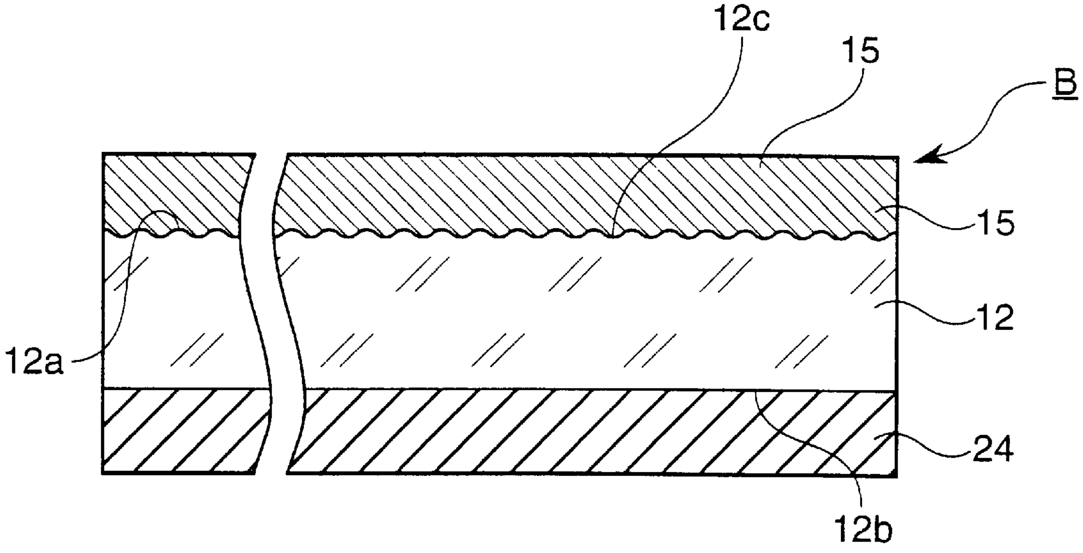
FIG. 16 is a sectional view of the timepiece indicating plate according to the twelfth embodiment of the present invention.

FIG. 16 is a sectional view of the timepiece indicating plate according to the twelfth embodiment of the present invention.

In the timepiece indicating plate B of this Embodiment, the surface of the front side (light incident side) 12*a* of the resin substrate 12 is furnished with minute irregularity pattern 12*c*, and coating film layer 15 is disposed on the front side thereof. Further, the back 12*b* (solar cell side) of the resin substrate 12 is furnished with a metallic thin film layer 24. Thus, the metallic thin film layer 24 is the same as in Embodiment 1, so that the description thereof is omitted below.

In this construction, the coating film layer 15 can be provided by applying a transparent resin (including a translucent resin) such as an acrylic resin, a urethane resin, an alkyd resin or an epoxy resin to the surface of the pattern 12*c* by coating or screen printing. This coating film layer 15 may be provided on the entirety or a part of the surface of the pattern 12*c*. According to necessity, polishing such as lapping polishing or buff polishing can be performed to thereby render the surface of the coating film layer 15 smooth and glossy so that the appearance quality of the indicating plate is enhanced.

Naturally, the back of the resin substrate 12 can be furnished with a multilayer laminate of metallic thin film layers as in Embodiment 4, can be subjected to coating and gradation coating as in Embodiment 5 and can partially be furnished with a cut off portion of metallic thin film layer by masking as in Embodiments 9 and 10.

This construction enables making the best use of the pattern 12*c* of the resin substrate 12 with its transparency held. Further, the metallic thin film layer 24 and the pattern 12*c* are spaced as much as the thickness of the resin substrate 12, so that, like the so-called thick coating polishing, this pattern enables a three-dimensional deep expression of the transparent resin substrate 12 to thereby diversify the design of the timepiece indicating plate.

Specifically, for example, the manufacturing of the timepiece indicating plate of this Embodiment was carried out as follows.

Resin substrate of polycarbonate furnished with electroformed sandy pattern was produced in the same manner as in Embodiment 1. Subsequently, the surface of this resin substrate was cleaned, and the surface of the back (side not furnished with pattern) of the resin substrate was subjected to the same vacuum deposition as in Embodiment 1 so that the surface was furnished with a gold coating of 410 Å thickness. Thus, there was provided the metallic thin film layer 24. Thereafter, the surface of the pattern side of the resin substrate was coated with a transparent paint composed of an acrylic resin. Thus, a timepiece indicating plate was obtained.

The obtained timepiece indicating plate was assembled in a solar timepiece. The color peculiar to gold was exhibited, and the sandy pattern became a three-dimensionally deep expression, like the so-called thick coating polishing, to thereby render the solar timepiece full of an appearance of superior quality. The brown or dark-blue solar cell and the insulating band cross lines were not viewed through the indicating plate. The light transmission of the timepiece indicating plate was about 15%, which was satisfactory for the energizing of the solar cell.

Embodiment 13

Figure 17:
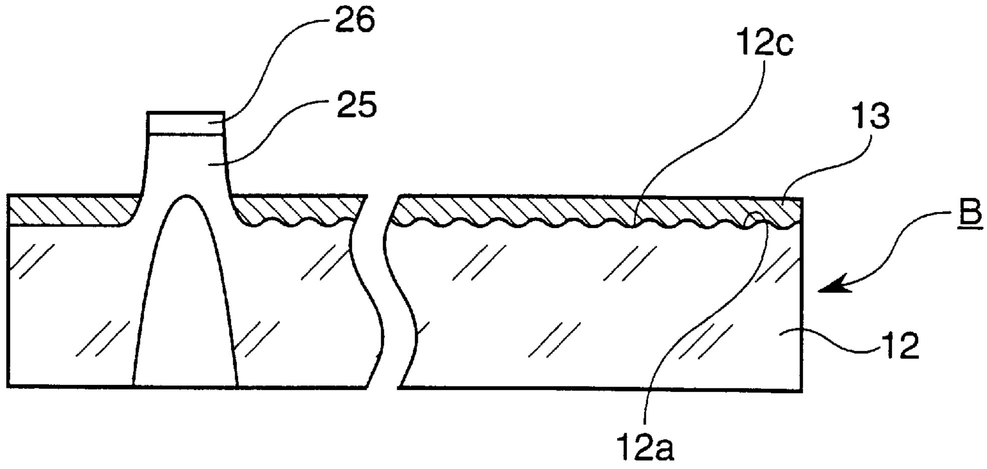
FIG. 17 is a sectional view of the timepiece indicating plate according to the thirteenth embodiment of the present invention.

FIG. 17 is a sectional view of the timepiece indicating plate according to the thirteenth embodiment of the present invention.

The timepiece indicating plate B of this Embodiment is basically the same as that of Embodiment 1 in that the metallic thin film layer 13 is formed on the surface of the front side (light incident side) 12*a* of the resin substrate 12 and in that the surface of the front side (light incident side) 12*a* of the resin substrate 12 is furnished with minute irregularity pattern 12*c*. However, the timepiece indicating plate B of this Embodiment is different from that of Embodiment 1 in that a surface protrusion 25 which constitutes, for example, a time character is provided by embossing. Thus, with respect to the same features as in Embodiment 1, the description thereof is omitted below.

In this construction, the formation of the surface protrusion 25 on the resin substrate 12 can be performed by embossing with the use of a pair of embossing dies.

Treatment 26 with, for example, a color ink, a color paint or a luminous paint may be effected on the upper surface of the surface protrusion 25. Also, the surface protrusion 25 may be provided with a metallic thin film layer composed of a metal which is different from that of the metallic thin film layer 13. This construction enables the resin substrate 12 per se to form a time character or the like by means of the surface protrusion 25, so that the process can be simplified and the cost can be reduced. Moreover, the design of the time character per se can be expanded by applying a color ink, a color paint, a luminous paint or a metallic thin film layer to the upper surface of the surface protrusion 25. As a result, the design of the timepiece indicating plate can be diversified.

Specifically, for example, the manufacturing of the timepiece indicating plate of this Embodiment was carried out as follows.

Resin substrate of polycarbonate furnished with electroformed sandy pattern was produced in the same manner as in Embodiment 1. Subsequently, this resin substrate 12 was embossed by the use of a pair of embossing dies to thereby provide surface protrusion 25. Thereafter, the surface of the resin substrate was cleaned, and the cleaned surface was subjected to the same vacuum deposition as in Embodiment 1 so that the surface was furnished with a silver coating of 135 Å thickness. Thus, there was provided the metallic thin film layer 13. Prior to the vacuum deposition, the upper surface of the surface protrusion 25 was masked with the use of a masking ink. After the vacuum deposition, the masking ink was removed from the upper surface of the surface protrusion 25 of the resin substrate 12, and an autoluminous paint of promethium or a light storing paint of, for example, zinc sulfide was applied thereto. Thus, a timepiece indicating plate was obtained.

The obtained timepiece indicating plate was assembled in a solar timepiece. The color peculiar to silver was exhibited, and the surface protrusion was bright in the night to thereby enable reading the time character. The brown or dark-blue solar cell and the insulating band cross lines were not viewed through the indicating plate. The light transmission of the timepiece indicating plate was about 45%, which was satisfactory for the energizing of the solar cell.

The foregoing Embodiments 1 through 13 are only working examples and the present invention is in no way limited thereby. Various modifications can naturally be made, for example, the back of the resin substrate 12 can be furnished with the pattern 12*d* in place of the furnishing of the front side of the resin substrate 12 with the pattern 12*c*. Moreover, although the timepiece indicating plate of the present invention has been described as one for use in the solar timepiece driven by the solar cell, it can naturally be used in common timepieces. In summary, the indicating plate for timepiece according to the present invention comprises a resin substrate through which light can be transmitted and a metallic thin film layer coating formed on at least one side of the resin substrate by dry plating, this timepiece indicating plate not only capable of preventing viewing of the solar cell from outside thereof through the timepiece indicating plate but also having a light transmission at least sufficient to cause the solar cell housed under the timepiece indicating plate to generate power.

Therefore, by virtue of the metallic thin film layer coating, the solar cell, cross lines and other items disposed under the indicating plate are not viewed therethrough. Some light is transmitted through the metallic thin film layer coating, so that the light transmission is so large as to contribute to the power generation of the solar cell with the result that the function of the solar timepiece per se is not inhibited. Furthermore, coloring can be made by the metallic color peculiar to the metal of the metallic thin film layer coating, thereby enabling extensively increasing a design variation.

Further, even if the same metallic thin film layer coating is used, various metallic colors can be obtained and the light transmission can be varied by changing the thickness of the metallic thin film layer coating.

At least one side of the resin substrate is at least partially furnished with an irregular pattern, such as a sandy pattern or a radial pattern, so that the same design expression as realized by the conventional indicating plate can be executed. As a result, a design variation inclusive of a tone and pattern with superior-quality appearance is extremely increased and a delicate hue can be produced.

In summing up, the timepiece indicating plate provided by the present invention has the following characteristics. The solar cell, insulating band cross lines and other items disposed under the indicating plate are not viewed through the indicating plate. The indicating plate can be colored by the metallic color peculiar to metal, and the same design expression as realized by the conventional metallic indicating plate can be executed. This extensively increases a design variation inclusive of a tone (delicate hue) and pattern with superior-quality appearance and enables endowing the indicating plate with an excellent appearance quality and an enhanced commercial value.

In the process for producing a timepiece indicating plate according to the present invention, the dry plating by vacuum deposition, ion plating or sputtering technique as a physical method is used. This enables easily executing the coating application to a resin being a nonconductor, especially only one side thereof as compared with the wet plating or the like. This also enables carrying out a film formation while monitoring the film thickness so that a precision control of film thickness and a mass production with high reproducibility can be realized.

In the resin substrate, a blend of different types of resins known as polymer alloy, for example, a polymer alloy consisting of a combination of at least two resins selected from among a polycarbonate resin, an acrylic resin, a polyacetal resin, an ABS resin, a polyethylene resin, a polypropylene resin, a polystyrene resin and a polyethylene terephthalate resin can be used. The employment of the above polymer alloy enables enhancing the adhesion with metallic thin film layer, surface treatability, moldability, hygroscopicity, etc. of the resin substrate.

Moreover, in the process for producing a timepiece indicating plate according to the present invention, an injection molding is conducted by means of an injection molding metal mold having an irregular pattern formed on its inner surface so that at least one side of the molded resin substrate is at least partially furnished with the irregular pattern. On this metal mold, the same design expression such as electroformed radial pattern or electroformed sandy pattern as realized by the conventional indicating plate can be executed by the conventional electroforming method. Thus, a design variation inclusive of a tone and pattern with superior quality appearance can extensively be increased, and a delicate hue can be produced. Furthermore, the pattern can be formed at the time of injection molding, so that continuous mass production can be realized to thereby enable attaining cost reduction.

In all the forms of the timepiece indicating plate of the present invention, some light is transmitted therethrough, and the light transmission thereof is in the range of 10 to 50% to thereby contribute to the power generation of the solar cell. Thus, the function of the solar timepiece per se is not inhibited, and the solar timepiece constantly operates without stopping.

What is claimed is:

1. An indicating plate for a timepiece to be arranged on a front surface side of a solar cell housed in a timepiece, said timepiece indicating plate comprising a resin substrate through which light can be transmitted and a metallic thin film layer coating formed on at least one side of the resin substrate by dry plating, said timepiece indicating plate being capable of preventing viewing of the solar cell from outside thereof through the timepiece indicating plate and having a light transmission at least sufficient to cause the solar cell housed under the timepiece indicating plate to generate power.

2. The timepiece indicating plate as claimed in claim 1, wherein the metallic thin film layer coating has a thickness of 100 to 500 Å.

3. The timepiece indicating plate as claimed in claim 1, wherein the metallic thin film layer coating consists of a single metallic thin film layer.

4. The timepiece indicating plate as claimed in claim 1, wherein the metallic thin film layer coating is a multilayer coating consisting of at least two metallic thin film layers.

5. The timepiece indicating plate as claimed in claim 1, wherein the metallic thin film layer coating has a portion partially cut off.

6. The timepiece indicating plate as claimed in claim 1, wherein the metallic thin film layer coating is composed of one metal selected from the group consisting of Au, Ag, Al, Cu, Co, Cr, Fe, In, Ni, Pd, Pt, Rh, Sn and Ti or an alloy of at least two metals selected from said group.

7. The timepiece indicating plate as claimed in claim 6, wherein the metallic thin film layer coating consists of a film of any of a nitride, an oxide and a carbide of said metal or alloy, or consists of a composite of such films.

8. The timepiece indicating plate as claimed in claim 1, wherein the resin substrate has at least one side thereof at least partially furnished with an irregularity pattern.

9. The timepiece indicating plate as claimed in claim 1, wherein the resin substrate is composed of a transparent resin or a colored resin.

10. The timepiece indicating plate as claimed in claim 1, wherein the resin substrate is composed of a polycarbonate resin, an acrylic resin, a polyacetal resin, an ABS resin, a polyethylene resin, a polypropylene resin, a polystyrene resin or a polyethylene terephthalate resin.

11. The timepiece indicating plate as claimed in claim 1, wherein the resin substrate is composed of a polymer alloy consisting of a combination of at least two resins selected from among a polycarbonate resin, an acrylic resin, a polyacetal resin, an ABS resin, a polyethylene resin, a polypropylene resin, a polystyrene resin and a polyethylene terephthalate resin.

12. The timepiece indicating plate as claimed in claim 1, wherein the resin substrate has its surface furnished with protrudent portions by embossing.

13. The timepiece indicating plate as claimed in claim 1, wherein the metallic thin film layer coating has its upper surface covered with a surface protective layer.

14. The timepiece indicating plate as claimed in claim 13, wherein the surface protective layer is prepared from a synthetic resin based paint or ink.

15. The timepiece indicating platelas claimed in claim 14, wherein the paint or ink comprises an acrylic resin, a urethane resin, an alkyd resin, an epoxy resin or a mixture thereof.

16. The timepiece indicating plate as claimed in claim 13, wherein the surface protective layer is composed of a synthetic resin film.

17. The timepiece indicating plate as claimed in claim 13, wherein the surface protective layer is composed of a metal oxide coating film.

18. The timepiece indicating plate as claimed in claim 13, wherein the surface protective layer is composed of a chromated coating film.

19. The timepiece indicating plate as claimed in claim 1, wherein the light transmission of the timepiece indicating plate is in the range of 10 to 50%.

20. The timepiece indicating plate as claimed in claim 1, wherein a marking by printing is formed on an upper surface of the timepiece indicating plate.

21. The timepiece indicating plate as claimed in claim 1, wherein a character or other marking member is bonded onto an upper surface of the timepiece indicating plate.

22. The timepiece indicating plate as claimed in claim 1, further comprising a means for mounting the timepiece indicating plate on a timepiece frame.

23. A process for producing an indicating plate for a timepiece to be arranged on a front surface side of a solar cell housed in a timepiece, said timepiece indicating plate comprising a resin substrate through which light can be transmitted and a metalic thin film layer coating formed on at least one side of the resin substrate, which process comprises the steps of:

conducting an injection molding of a resin to prepare a resin substrate; and forming a metallic thin film layer coating on at least one side of the resin substrate by dry plating;

wherein said timepiece indicating plate is capable of preventing viewing of the solar cell from outside therof through the timepiece plate and also having a light transmission at least sufficient to cause the solar cell housed under the timepiece indicating plate to generate power.

24. The process as claimed in claim 23, wherein the dry plating is vacuum deposition, ion plating or sputtering.

25. The process as claimed in claim 23, wherein the metallic thin film layer coating formed by the dry plating has a thickness of 100 to 500 Å.

26. The process as claimed in claim 23, wherein the injection molding is performed with the use of a metal mold having an irregularity pattern provided on its inner surface so that at least one side of the resin substrate is at least partially furnished with the irregularity pattern.

27. The process as claimed in claim 23, wherein cleaning of the resin substrate on its surfaces is performed prior to the step of forming the metallic thin film layer coating.

28. The process as claimed in claim 27, wherein the cleaning is performed by ion bombardment.

29. The process as claimed in claim 27, wherein the cleaning is performed by heating.

30. The process as claimed in claim 23, wherein the step of forming the metallic thin film layer coating includes masking and etching conducted to form a metallic thin film layer having partially cut off portion.

31. The process as claimed in claim 23, wherein embossing of the resin substrate so as to furnish its surface with protrudent portions is performed prior to the step of forming the metallic thin film layer coating.

32. The process as claimed in claim 23, further comprising forming a surface protective layer on an upper surface of the metallic thin film layer coating.

33. The process as claimed in claim 32, wherein the surface protective layer is formed from a synthetic resin based paint or ink.

34. The process as claimed in claim 33, wherein the paint or ink is prepared from an acrylic resin, a urethane resin, an alkyd resin, an epoxy resin or a mixture thereof.

35. The process as claimed in claim 32, wherein the surface protective layer is formed of a synthetic resin film.

36. The process as claimed in claim 32, wherein the surface protective layer is formed of a metal oxide coating film.

37. The process as claimed in claim 32, wherein the surface protective layer is formed of a chromated coating film.

38. The process as claimed in claim 23, further comprising attaching a marking or a time character or other marking member onto an upper surface of the timepiece indicating plate by printing to thereby finish the timepiece indicating plate.

39. The process as claimed in claim 23, wherein, in the injection molding, step the timepiece indicating plate is fitted with means for mounting the timepiece indicating plate on a timepiece frame by monolithic molding.

* * * * *

UNITED STATES PATENT AND TRADEMARK OFFICE
CERTIFICATE OF CORRECTION

PATENT NO. : 6,538,959 B1
DATED : March 25, 2003
INVENTOR(S) : Katsuyuki Yamaguchi et al.

It is certified that error appears in the above-identified patent and that said Letters Patent is hereby corrected as shown below:

Title page, Item [54] and Column 1, lines 1-2,
"DISPLAY PLATE FOR TIMEPIECES AND METHOD FOR FABRICATING THE SAME" should read -- INDICATING PLATE FOR TIMEPIECE AND PRODUCTION THEREOF --.

Column 2,
Line 42, heading "SUMMARY" should read -- SUMMARY OF THE INVENTION --.

Column 3,
Line 49, "of such items." should read -- of such films --.

Column 4,
Line 40, "techniqueissuch" should read -- technique such --.

Column 5,
Line 40, "massproduction" should read -- mass production --.

Column 6,
Line 47, "techniques" should read -- technique --.
Line 48, "technique" should read -- techniques --.

Column 8,
Line 44, after "embedding" insert comma (,).

Column 9,
Line 14, "polymer a alloy" should read -- a polymer alloy --.
Line 58, "mass producron" should read -- mass production --.

Column 11,
Line 4, Table 2 title, "Depositior" should read -- Deposition --.

UNITED STATES PATENT AND TRADEMARK OFFICE

CERTIFICATE OF CORRECTION

PATENT NO. : 6,538,959 B1
DATED : March 25, 2003
INVENTOR(S) : Katsuyuki Yamaguchi et al.

It is certified that error appears in the above-identified patent and that said Letters Patent is hereby corrected as shown below:

Column 12,
Line 57, after "designated $A_1$" insert period (.)

Column 13,
Line 10, "frane" should read -- frame --.

Column 14,
Line 54, "embodiments-specifically" should read -- emobodiments. Specifically --.

Column 16,
Line 23, "Åthickness" should read -- Å thickness --.

Column 19,
Line 24, after "Ag or Cu" delete period (.) and insert comma (,).

Column 21,
Line 39, "(1.33x$10^{-4\ to}$" should read -- (1.33x$10^{-4}$ to --.

Column 24,
Line 17, "example;" should read -- example, --.
Line 17, "Thereafler" should read -- Thereafter --.

Column 26,
Line 52, "making" should read -- masking --.

Column 27,
Line 15, "metallic" should read -- a metallic --.

Column 32,
Line 34, "platelas" should read -- plate as --.
Line 54, "wherein a character" should read -- wherein a time character --.
Line 63, "metalic" should read -- metallic --.

Column 33,
Line 4, "therof" should read -- thereof --.
Line 17, "timepiece plate" should read -- timepiece indicating plate --.

UNITED STATES PATENT AND TRADEMARK OFFICE

CERTIFICATE OF CORRECTION

PATENT NO. : 6,538,959 B1
DATED : March 25, 2003
INVENTOR(S) : Katsuyuki Yamaguchi et al.

It is certified that error appears in the above-identified patent and that said Letters Patent is hereby corrected as shown below:

Column 34,
Line 27, "molding, step the" should read -- molding step, the --.

Signed and Sealed this

Twenty-eighth Day of October, 2003

JAMES E. ROGAN
*Director of the United States Patent and Trademark Office*